US008017458B2

(12) United States Patent
Marks et al.

(10) Patent No.: US 8,017,458 B2
(45) Date of Patent: Sep. 13, 2011

(54) SOLUTION-PROCESSED HIGH MOBILITY INORGANIC THIN-FILM TRANSISTORS

(75) Inventors: Tobin J. Marks, Evanston, IL (US); Antonio Facchetti, Chicago, IL (US); Paul D. Byrne, Lowell, MA (US); Hyun Sung Kim, Seoul (KR)

(73) Assignee: Northwestern University, Evanston, IL (US)

( * ) Notice: Subject to any disclaimer, the term of this patent is extended or adjusted under 35 U.S.C. 154(b) by 14 days.

(21) Appl. No.: 12/322,399

(22) Filed: Feb. 2, 2009

(65) Prior Publication Data
US 2009/0206341 A1 Aug. 20, 2009

Related U.S. Application Data

(60) Provisional application No. 61/063,089, filed on Jan. 31, 2008, provisional application No. 61/189,351, filed on Aug. 18, 2008.

(51) Int. Cl.
*H01L 21/00* (2006.01)

(52) U.S. Cl. .. 438/149; 438/758; 438/763; 257/E29.151

(58) Field of Classification Search .......... 438/149–167, 438/758, 761, 789, 793; 257/E29.151
See application file for complete search history.

(56) References Cited

U.S. PATENT DOCUMENTS

| | | | |
|---|---|---|---|
| 5,156,918 A | 10/1992 | Marks et al. | |
| 6,549,685 B2 | 4/2003 | Marks et al. | |
| 6,767,907 B2 | 7/2004 | Perregaard et al. | |
| 6,855,274 B1 | 2/2005 | Marks et al. | |
| 7,605,394 B2 | 10/2009 | Marks et al. | |
| 7,679,079 B1 | 3/2010 | Marks et al. | |
| 2004/0147113 A1* | 7/2004 | Yamazaki et al. | 438/660 |
| 2005/0163938 A1* | 7/2005 | Yamazaki et al. | 427/554 |
| 2006/0006378 A1 | 1/2006 | Hirai | |
| 2006/0202195 A1 | 9/2006 | Marks et al. | |
| 2006/0284171 A1 | 12/2006 | Levy et al. | |
| 2007/0181961 A1 | 8/2007 | Marks et al. | |
| 2007/0184576 A1 | 8/2007 | Chang et al. | |
| 2007/0284629 A1 | 12/2007 | Marks et al. | |
| 2007/0287221 A1 | 12/2007 | Ong et al. | |
| 2008/0001538 A1 | 1/2008 | Cok | |
| 2008/0012471 A1 | 1/2008 | Cok | |
| 2008/0017854 A1 | 1/2008 | Marks et al. | |
| 2008/0020572 A1 | 1/2008 | Wu et al. | |
| 2009/0050876 A1 | 2/2009 | Marks et al. | |

OTHER PUBLICATIONS

Yoon, M-H; Yan, H; Facchetti, A; Marks, TJ. Low-Voltage Organic Field-Effect Transistors and Inverters Enabled by Ultrathin Cross-Linked Polymers as Gate Dielectric. J. Am. Chem. Soc. 2005, 127, pp. 10388-10395 (copy submitted on May 14, 2010).

Yoon, M-H; Yan, H; Facchetti, A; Marks, TJ. σ-π molecular dielectric multilayers for low-voltage organic thin film transistors. PNAS, Mar. 29, 2005, vol. 102, No. 13, pp. 4678-4682 (copy submitted on May 14, 2010).

* cited by examiner

*Primary Examiner* — Brook Kebede

(74) *Attorney, Agent, or Firm* — K&L Gates LLP

(57) ABSTRACT

Fluid media comprising inorganic semiconductor components for fabrication of thin film transistor devices.

48 Claims, 19 Drawing Sheets

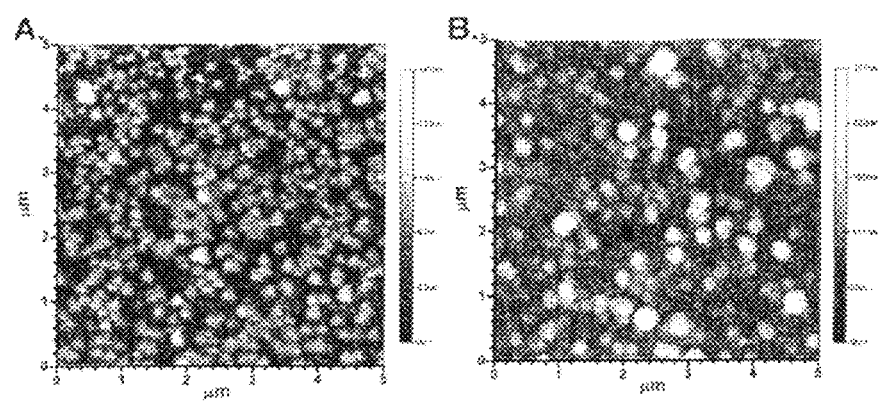
Figure 6. AFM images of CBD CdSe films grown on the indicated substrates and annealed at 400°C: A. p$^+$-Si/SiO$_2$ and B. n$^+$-Si/SAND substrates.

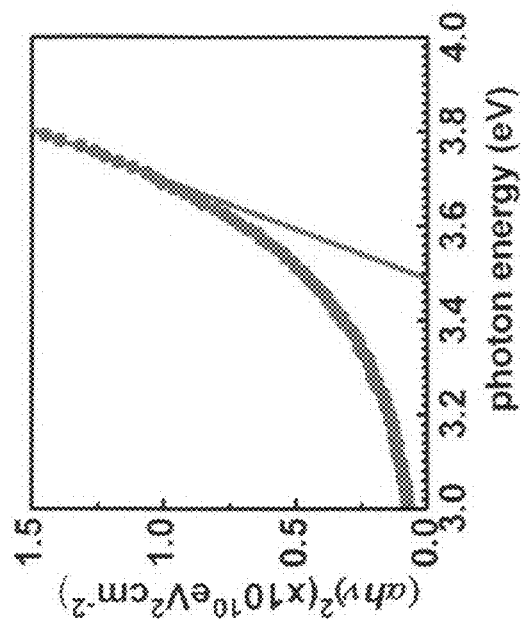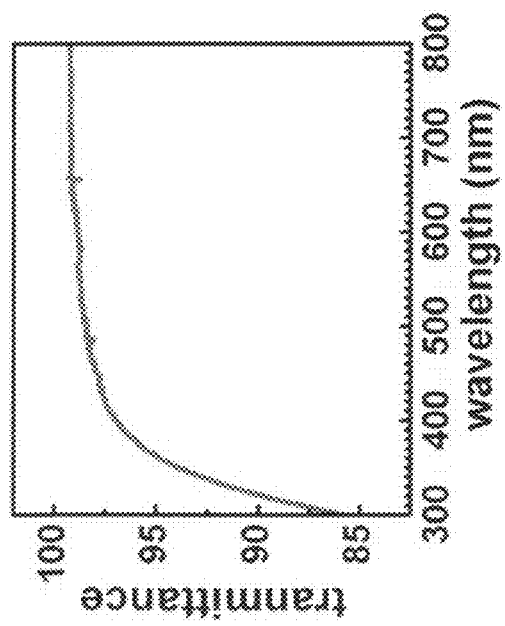
Figure 16

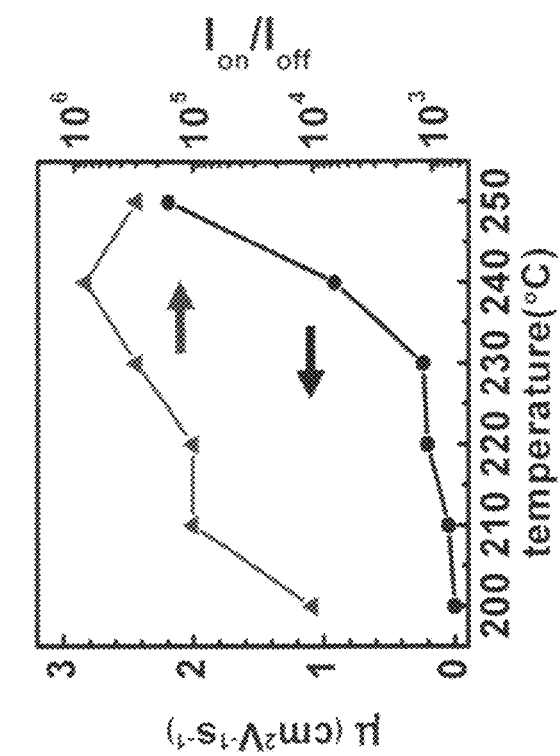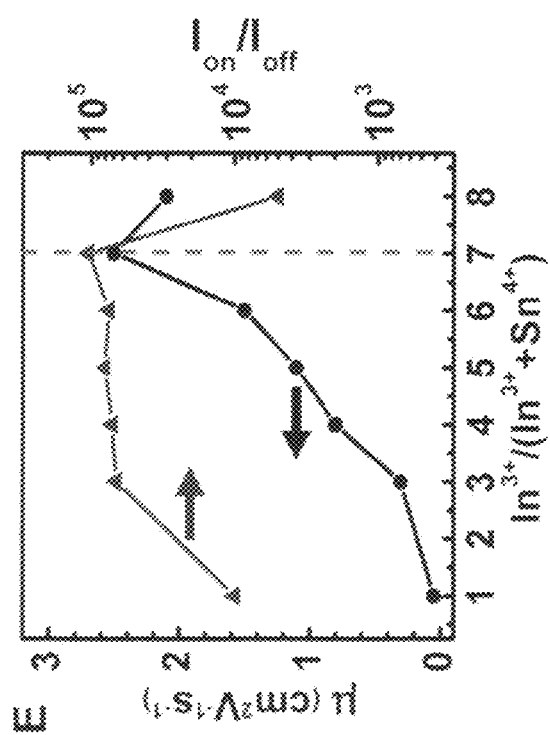
Figure 17

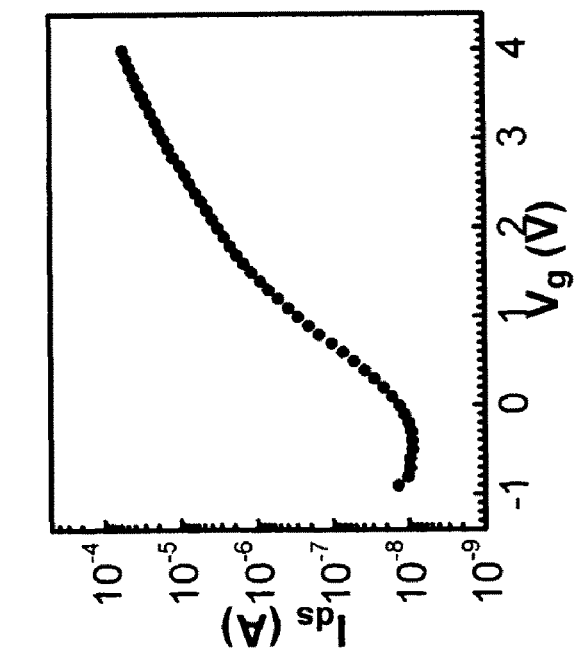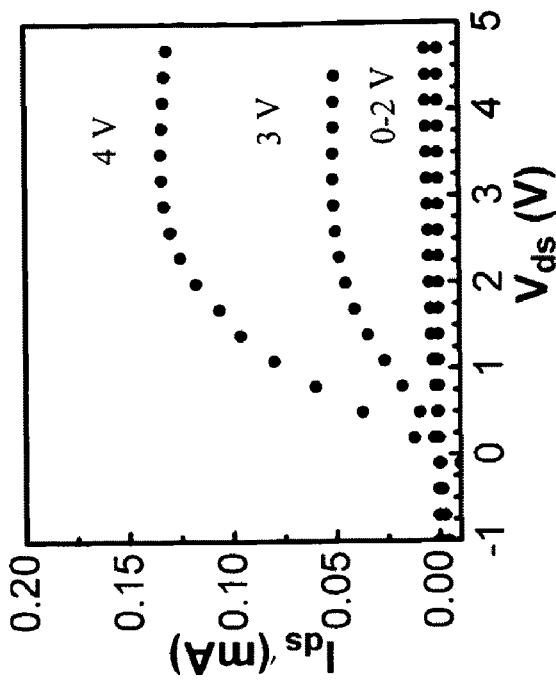
Figure 18

SOLUTION-PROCESSED HIGH MOBILITY INORGANIC THIN-FILM TRANSISTORS

CROSS REFERENCE TO RELATED APPLICATIONS

This application claims priority to and the benefit of U.S. Provisional Patent Application Ser. Nos. 61/063,089, filed on Jan. 31, 2008, and 61/189,351, filed on Aug. 18, 2008, the disclosure of each of which is incorporated by reference herein in its entirety.

STATEMENT REGARDING FEDERALLY SPONSORED RESEARCH OR DEVELOPMENT

This invention was made with government support under Grant Nos. STTR TSI-2260-0674731/W31P4Q-05-C-0335 awarded by the U.S. Army Aviation and Missile Command. The government has certain rights in the invention.

BACKGROUND OF THE INVENTION

The fabrication of high-performance thin-film transistors (TFTs) by solution phase processes is a promising approach to developing commercially viable, low-cost, large-area electronics. Despite intense efforts to develop solution-processed organic semiconducting films, the highest field-effect mobilities ($\mu_{FET}$s) for organic TFTs (OTFTs) reported to date are ~1.0 cm$^2$ V$^{-1}$ s$^{-1}$ (p-type, small molecule), 0.21 cm$^2$ V$^{-1}$ s$^{-1}$ (n-type, small molecule), ~0.6 cm$^2$ V$^{-1}$ s$^{-1}$ (p-type, polymer), and 0.1 cm$^2$ V$^{-1}$ s$^{-1}$ (n-type, polymer). These values are lower than those of optimized OTFTs fabricated with vapor-deposited or single-crystal organic semiconductors by up to ~10×. These observations suggest that conventional OTFTs will be useful for low- or medium-performance applications but not for solution-processed high-speed circuits. Consequently, inorganic semiconductors emerge as potential candidates since they can exhibit bulk field effect mobilities in excess of 100 cm$^2$ V$^{-1}$ s$^{-1}$.

However, inorganic semiconductors are typically intractable in common solvents so that soluble precursors must be employed, then converted to the active semiconducting films. This approach typically requires noxious solvents and high annealing temperatures (>500° C.) to achieve sufficient film crystallinity and texturing (for crystalline semiconductors) for acceptable charge transport properties. High annealing temperatures are incompatible with inexpensive plastic substrates. Furthermore, when bottom-gate transistors are fabricated, the gate insulator must be sufficiently robust to survive the processing conditions and thin enough to ensure low operating voltages. Thus, these requirements significantly limit the temperatures at which the semiconductor films can be annealed and/or the choice of materials for the gate dielectric. For example, ultra-thin inorganic films deposited from solution are invariably leaky and morphologically very rough. Meanwhile, many known polymeric dielectric materials are not sufficiently stable, whether thermally and/or mechanically, to withstand high annealing temperatures and aggressive aqueous solutions. Furthermore, and not obvious a priori, the dielectric surface must nucleate inorganic semiconductor film growth from solution when bottom-gate TFTs are fabricated. As such, to date, TFTs have not been fabricated using both a solution-processed inorganic semiconductor and a solution-processed gate dielectric.

Recently, several metal oxides have emerged as promising semiconductors for low-temperature processed TFTs. These include indium oxide (In$_2$O$_3$), zinc oxide (ZnO), tin dioxide (SnO$_2$), indium-gallium oxides (IGO), amorphous zinc-tin oxides (a-ZTO), amorphous indium-zinc oxides (a-IZO), amorphous indium-gallium-zinc oxides (a-IGZO), and amorphous cadmium-indium-antimony oxides. Polycrystalline oxides like ZnO have columnar grain structures even when deposited at room temperature. Their films inevitably suffer from problems associated with large densities of grain boundaries, including instability to air due to O$_2$/H$_2$O/CO$_2$ chemisorption and film surface roughness due to facet formation.

Amorphous metal oxide films generally exhibit more uniform microstructures and smoother surfaces than crystalline oxides, which in turn yield better adhesion to the substrate. However, these films are usually deposited from the vapor phase, using methods such as sputtering and pulsed-laser deposition. Combinatorial approaches have been utilized to find high-mobility and low carrier doping compositions useful for TFT applications. For example, amorphous metal oxides including In—Ga—Zn—O, In—Zn—O, Zn—Sn—O, and In—Sn—O have been investigated for TFT applications. However, in these studies, the different vapor pressures of the individual element precursors often lead to difficulties in tuning the optimum film composition and, importantly, reproducibility problems. In addition, low-pressure deposition processes are expensive to scale for large areas and high throughput. Meanwhile, previous metal-oxide-based TFTs fabricated by solution deposition generally exhibit poor performance, in particular low field-effect mobilities, low I$_{on}$:I$_{off}$ ratios and large operating voltages, any of which tend to preclude most practical applications.

Accordingly, there is a need in the art for new formulations for processing inorganic semiconductor materials in solution and associated methods for fabricating inorganic (e.g., metal oxide and chalcogenides) TFTs by semiconductor solution deposition techniques. In addition, the need to develop high-performance TFTs from solution and annealed at temperature <500 C as well as to further explore organic dielectric compatibility with solution-processed high-$\mu_{FET}$s inorganic semiconductors remains an ongoing concern in the art.

SUMMARY OF THE INVENTION

In light of the foregoing, it is an object of the present invention to provide various semiconductor and dielectric components and/or transistor devices and related methods for their production and/or assembly, thereby overcoming various deficiencies and shortcomings of the prior art, including those outlined above. It will be understood by those skilled in the art that one or more aspects of this invention can meet certain objectives, while one or more other aspects can meet certain other objectives. Each objective may not apply equally, in all its respects, to every aspect of this invention. As such, the following objects can be viewed in the alternative with respect to any one aspect of this invention.

It can be an object of the present invention to provide material components, structures and/or device configurations meeting the aforementioned requirements while, in addition, fully realizing the benefits available from TFT technologies.

It can be an object of the present invention to provide formulations that can be used to prepare inorganic (e.g., metal oxide-based) thin film semiconductors using various solution processes. The present solution-processed inorganic thin films can be incorporated into articles of manufacture such as field effect transistors (e.g., thin film transistors), photovoltaics, organic light emitting devices such as organic light emitting diodes (OLEDs) and organic light emitting transistors (OLETs), complementary metal oxide semiconductors (CMOSs), complementary inverters, D flip-flops, rectifiers, and ring oscillators. The present solution-processed inorganic thin films can provide advantageous field-effect mobilities, which without wishing to be bound by any particular theory, can be achieved through improved film texturing, improved film stoichiometry, and/or interfacial and related morphological considerations.

It can be an object of the present invention, alone or in conjunction with the preceding objective, to provide an inorganic semiconductor component, as can comprise but is not limited to a metal oxide or a metal selenide, with favorable performance properties, including crystallinity and high field-effect mobilities, as can be available through solution-processed inorganic semiconductor materials using fabrication techniques and/or annealing temperatures of the sort described herein.

It can be an object of the present invention to provide a multicomponent metal oxide semiconductor component for use in transistor devices. The solution-phase process described herein, in particular, with the use of the precursor compositions described herein, allows optimization of the ratio of multiple metals in the multicomponent metal oxide which is not obtainable by methods such as vacuum deposition.

It can be an object of this invention to provide a wide range of organic or inorganic dielectric materials compatible with a variety of substrates, including organic and/or flexible substrates, compatible with a variety of inorganic semiconductors (including both n- and p-type), and enable efficient operation of such semiconductor components.

It can be another object of the present invention, alone or in conjunction with one or more of the preceding objectives, to provide an organic dielectric component with favorable performance properties including but not limited to capacitance and thermal stability under solution-processed inorganic semiconductor fabrication techniques.

It can be another object of the present invention, alone or in conjunction with one or more of the preceding objectives to provide various compatible combinations of such components through the fabrication of a range of transistor configurations and related device structures.

Other objects, features, benefits and advantages of the present invention will be apparent from this summary and the following descriptions of certain embodiments, and will be readily apparent to those skilled in the art having knowledge of thin film transistor devices, transistor components and related assembly/fabrication techniques. Such objects, features, benefits and advantages will be apparent from the above as taken into conjunction with the accompanying examples, data, figures and all reasonable inferences to be drawn therefrom, alone or with consideration of the references incorporated herein.

In some embodiments, the present invention can be directed to a transistor device, such a device comprising a substrate, the electrical conductors (source, drain, and gate), a dielectric component on or coupled to the gate conductor and the substrate, and an inorganic semiconductor component coupled to the dielectric and the source and drain conductors and/or related methods of preparation. Available substrate materials are known in the art and include, without limitation, any and all materials compatible with the fabrication techniques described herein. Available conducting materials are known in the art and include, without limitation, any and all materials compatible with the fabrication techniques described herein. The inorganic semiconductor component can be coupled to the dielectric component, and the two components together can form a thin film composite. In other embodiments, the present invention can be directed to a transistor device, such a device comprising a substrate, the electrical conductors (source, drain, and gate), an inorganic semiconductor component coupled to the source and drain conductors, a dielectric component on or coupled to the inorganic semiconductor component, and the gate conductor coupled to the dielectric. As used herein, coupled" can mean the simple physical adherence of two materials without forming any chemical bonds (e.g., by adsorption), as well as the formation of chemical bonds (e.g., ionic or covalent bonds) between two or more components and/or chemical moieties, atoms, or molecules thereof.

Accordingly, the present invention can, in part, be directed to a method of preparing a transistor device. Such a method can comprise providing a device structure comprising an organic dielectric component coupled to a substrate component; providing a fluid medium comprising an inorganic semiconductor component, such a semiconductor component comprising a compound of the sort described elsewhere herein or as would otherwise be understood by those skilled in the art made aware of this invention; and contacting such a fluid medium and device structure, such contact at least partially sufficient to actively couple such a semiconductor component to such a dielectric component. As would also be understood by those skilled in the art made aware of this invention and/or as a distinction over prior art methods and techniques, such sufficient contact can be considered so as to provide a semiconductor component with active semiconducting properties in the context of an applicable device structure without further chemical reaction and/or physical modification.

In certain embodiments, such a device structure can be positioned in a fluid medium. In certain such embodiments, such a medium can be aqueous, with such a semiconductor component the reaction product of precursor reagents at least partially soluble therein. Without limitation, such a semiconductor component can comprise a metal selenide. In certain other non-limiting embodiments, fluid medium contact can comprise a process selected from known printing and casting processes. In certain such embodiments, such a fluid medium can be a sol-gel system comprising such a semiconductor component. Without limitation, such a semiconductor component can comprise a metal oxide.

In certain embodiments, the semiconductor component can be prepared from a precursor composition. The precursor composition can include one or more metal salts and a base in a solvent, with the base and the metal salt(s) present in the solvent at a relative molar ratio that leads to optimal morphological and/or microstructural features in the semiconductor component. For example, when incorporated into a thin film transistor, a semiconductor component prepared according to the present invention can exhibit enhanced field effect characteristics, e.g., increased field effect mobilities and/or increased $I_{on}:I_{off}$ ratios.

In certain embodiments, the present invention relates to precursor compositions for fabricating (in solution-phase) a metal oxide thin film semiconductor. Exemplary metal oxides include $In_2O_3$, $InZnO_2$, $InSnO_2$, In—Ga—Sn—O, and $SnO_2$. The precursor composition generally includes one or more metal salts and a base in a solvent. In some embodiments, the precursor composition can include one or more trivalent metal salts. Salt forms that can be used according to the present teachings include halides (e.g., chlorides, bromides, iodides), oxalates, carbonates, acetates, formates, propionates, sulfites, sulfates, acetylacetonates, hydroxides, nitrates, perchlorates, trifluoroacetates, trifluoroacetylacetonates, trifluoromethanesulfonates, tosylates, mesylates, and hydrates thereof. In certain embodiments, the precursor composition can include one or more indium ($In^{3+}$) salts (e.g., indium chloride, $InCl_3$). In certain embodiments, the precursor composition can include one or more gallium ($Ga^{3+}$) salts (e.g., gallium chloride, $GaCl_3$). In particular embodiments, the precursor composition can include one or more tetravalent salts, for example, one or more tin ($Sn^{4+}$) salts (e.g., tin (IV) chloride, $SnCl_4$). In some embodiments, the precursor composition can include one or more divalent salts, for example, one or more zinc ($Zn^{2+}$) salts (e.g., zinc acetate, $Zn(Ac)_2$). In certain embodiments, the precursor composition can include metal salts of metals of different valence states. For example, the precursor composition can include one or more indium salts and optionally one or more divalent or tetravalent metal salts and/or another non-indium trivalent metal salt.

The concentration of metal salts in the precursor composition can be between about 0.01 M and about 5.0 M. For example, the metal salt can have a concentration between about 0.02 M and about 2.0 M, between about 0.05 M and about 1.0 M, between about 0.05 M and about 0.5 M, or between about 0.05 M and about 0.25 M. In embodiments in which the precursor composition includes two or more metal salts, the precursor composition can include equimolar amounts of the two or more metal salts. For example, in a precursor composition that includes a trivalent metal salt (e.g., $In^{3+}$) and a tetravalent (e.g., $Sn^{4+}$) or divalent ($Zn^{2+}$) metal salt, $[In^{3+}]:[Sn^{4+}]$ or $[In^{3+}]:[Zn^{2+}] \sim 1$.

The base in the precursor composition can be a Brønsted base or a Lewis base as understood by those skilled in the art. For example, the base can be selected from alanine ($C_3H_5O_2NH_2$), ammonia ($NH_3$), aniline ($C_6H_5NH_2$), dimethylamine (($CH_3$)$_2$NH), 2-ethanolamine ($NH_2CH_2CH_2OH$), 3-propanolamine, diethanolamine, 2-methylaminoethanol, N,N-dimethylaminoethanol, methoxyethylamine, methoxypropylamine, diaminoethane, diaminopropane, diaminobutane, diaminocyclohexane, ethylamine ($C_2H_5NH_2$), glycine ($C_2H_3O_2NH_2$), hexamethylenetetramine ($C_6H_{12}N_4$), hexamethylenediamine ($NH_2(CH_2)_6NH_2$), hydrazine ($N_2H_4$), methylamine ($CH_3NH_2$), trimethylamine (($CH_3$)$_3$N), imidazole ($C_2H_5NH_2$), pyridine ($C_5H_5N$), pyrimidine ($C_4H_4N_2$), pyrazine ($C_4H_4N_2$), piperidine ($C_5H_{11}N$), piperazine ($C_4H_{10}N_2$), quinoline ($C_9H_7N$), 1-3-thiazole ($C_2H_3O_2NH_2$), imides ($R_2C=NH$), amides ($RCONH_2$), as well as metal (M) hydroxides (M=Li, Na, K, Rb, Cs, Ba, Ca), metal carbonates, metal bicarbonates, and mixtures thereof. In some embodiments, the precursor composition can include one or more organic bases. For example, the precursor composition can include an organoamine. In certain embodiments, the precursor composition can include an aminoalcohol selected from ethanolamine, propanolamine, and an aminodiol such as diethanolamine.

The solvent can be water or one or more organic solvents. For example, the solvent can be selected from water, an alcohol, an aminoalcohol, a carboxylic acid, a glycol, a hydroxyester, an aminoester, and a mixture thereof. In some embodiments, the solvent can be selected from water, methanol, ethanol, propanol, butanol, pentanol, hexyl alcohol, heptyl alcohol, ethyleneglycol, methoxyethanol, ethoxyethanol, methxypropanol, ethoxypropanol, methoxybutanol, dimethoxyglycol, N,N-dimethylformamide, and mixtures thereof.

In some embodiments, the precursor composition can further include one or more additives independently selected from detergents, dispersants, binding agents, compatiblizing agents, curing agents, initiators, humectants, antifoaming agents, wetting agents, pH modifiers, biocides, and bacteriostats. For example, surfactants, chelates (e.g., ethylenediaminetetraacetic acid (EDTA)), and/or other polymers (e.g., polystyrene, polyethylene, poly-alpha-methylstyrene, polyisobutene, polypropylene, polymethylmethacrylate and the like) can be included as a dispersant, a binding agent, a compatiblizing agent, and/or an antifoaming agent.

The molar ratio of the base to the one or more metal salts ([base]:[metal salts]) in the precursor composition can be between about 1 and about 20. For example, the precursor composition can have a [base]:[metal salts] ratio between about 2 and about 15, between about 2 and about 12, between about 5 and about 15, between about 5 and about 12, between about 5 and about 10, or between about 7 and about 10. In certain embodiments, the precursor composition can have a [base]:[$In^{3+}$] ratio between about 1 and about 15, between about 2 and about 15, between about 2 and about 12, between about 5 and about 15, between about 5 and about 12, between about 5 and about 10, or between about 7 and about 10. In other embodiments, the precursor composition can have a [base]:[$In^{3+}+Sn^{4+}$] ratio or [base]:[$In^{3+}+Zn^{2+}$] ratio between about 1 and about 15, between about 2 and about 15, between about 2 and about 12, between about 5 and about 15, between about 5 and about 12, between about 5 and about 10, or between about 7 and about 10.

As demonstrated by the examples herein, an optimal [base]:[metal salts] ratio can lead to a solution-processed semiconductor component with enhanced properties. For example, the resulting semiconductor component, for example, in thin film forms, can have better surface morphologies (e.g., film smoothness and uniform thickness), enhanced texturing, and/or a preferential phase growth that confers better semiconductor performance.

The phase formation of polycrystalline metal oxides can be analyzed using, for example, x-ray diffraction (XRD) techniques. For $In_2O_3$ thin films, the 004 reflection is associated with higher carrier mobility, whereas the 222 reflection is associated with lower carrier mobility. Accordingly, in various embodiments for fabricating an $In_2O_3$ thin film semiconductor, the precursor composition can include a [base]:[$In^{3+}$] ratio that provides a crystalline $In_2O_3$ film having a (004)/(222) plane diffraction intensity ratio of greater than 1 when analyzed by X-ray diffraction. In certain embodiments, the (004)/(222) plane diffraction intensity ratio can be greater than 10, e.g., the 004 reflection is predominant, and the 222 reflection is substantially suppressed. As such, the present teachings can relate to a method of increasing the electron mobility of a metal oxide-based thin film transistor by depositing a crystalline metal oxide from a precursor formulation that includes one or more metal salts and a base, wherein the [base]:[metal salts] ratio can lead to the preferential growth of a higher-mobility oxide phase. For amorphous metal oxide thin films, increased mobilites also can be observed when a precursor formulation having the [base]:[metal salts] ratios described herein is used to fabricate TFTs. While unlike crystalline metal oxides, such increase in mobilities cannot be attributed to the preferential growth of a particular oxide phase, without wishing to be bound by any particular theory, it is believed that the presence of the base can lead to enhanced film morphology, improved film stoichiometry, and/or residual amounts of metal-OH groups (hence, hydrogen bonds), which in turn provides a more stable film.

The semiconductor component can be prepared by depositing on a substrate a precursor composition according to the present invention to provide a semiconductor precursor (or deposited composition), and heating (or annealing) the semiconductor precursor (or deposited composition) to form the semiconductor component. The depositing step can be carried out by various solution-phase methods. For example, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin-coating, drop-casting, zone casting, dip coating, blade coating, spraying, rod coating, or stamping.

Regardless, either before (as in a top-gate device structure) or after (as in a bottom-gate device structure) coupling to a dielectric component, such a semiconductor component can be annealed—for instance, to provide sufficient film crystallinity and texture or eliminating the solvent. In various embodiments, thermal annealing (heating) of the semiconductor component can be carried out at a temperature or several temperatures between about 100° C. and about 700° C. For example, heating can be carried out at a temperature between about 200° C. and about 500° C. In certain embodiments, heating can be carried out at a temperature lower than about 500° C. In some embodiments, the heat treatment can be performed in an instant heating manner at a certain temperature using a pre-heated heating equipment. In other embodiments, heating can be performed in a gradual manner with a heating rate ranging for example from about 0.5 to about 100° C. per minute starting from the room temperature or starting from a temperature between about 25° C. and about 100° C. In certain embodiments, depending upon semiconductor identity, composition and/or desired properties, such a component can be annealed at a temperature lower than or 400° C., lower than or about 300° C., lower than or about 250° C., lower than or about 200° C., or lower than or about 100° C. In some embodiments, heating can be performed in a stepwise manner at one or more temperatures. The heating step can be carried out by various methods known in the art, for example, by using resistive elements (e.g., ovens), IR radiation (e.g., IR lamps), microwave radiation (e.g., microwave ovens), and/or magnetic heating. As discussed below and demonstrated elsewhere herein, such semiconductor preparation and processing can be achieved without undue adverse effect on such a dielectric component and/or device performance.

In certain embodiments, the present semiconductor components can comprise a metal selenide such as but not limited to a cadmium selenide or a metal oxide such as but not limited to $In_2O_3$, $InSnO_2$, $InZnO_2$, In—Ga—Zn—O, and $SnO_2$, as well as other inorganic materials of the sort discussed herein. The semiconductor component can be crystalline or amorphous. More broadly, such a semiconductor component can comprise other available Group 12 metals, Group 13 metals, Group 14 metals, and/or Group 15 metals, in particular selenides and oxides thereof. In certain such embodiments, such oxides can comprise two or more metals, for example, three or more metals. In certain other embodiments, such a semiconductor component can comprise two or more different types of metal oxides and/or selenides. From a structural-functional perspective, such a semiconductor component can comprise a metal oxide or metal selenide providing advantageous field-effect mobilities, such mobilities as can be approached through an improved component crystallinity and interfacial and related morphological considerations of the type described herein. Alternatively, with respect to various broader aspects of this invention, an inorganic semiconductor component can comprise one or more semiconducting metal or metalloid chalcogenides (e.g., sulfides, selenides, tellurides, etc.), pnictinides (e.g., gallium, indium, thallium, etc.) carbides and the like. Such components are limited only by active semiconductor function upon device incorporation and availability using fluid media of the sort described herein (e.g., without limitation, solution-processed or solution-deposited inorganic semiconductors), such materials and fabrication techniques as described herein and as would be understood by those skilled in the art made aware of this invention. Regardless, such a semiconductor can comprise a thin film, wire, nanowire, nanotube or nanoparticle configuration, or as otherwise could function in the context of a particular device structure—such configurations as would be understood by those skilled in the art.

The semiconductor component fabricated according to the present teachings can be used in various types of field effect transistors including top-gate top-contact structures, top-gate bottom-contact structures, bottom-gate top-contact structures, and bottom-gate bottom-contact structures. The semiconductor component can be deposited on a substrate component and/or a dielectric component. The substrate component can be selected from doped silicon, an indium tin oxide (ITO), ITO-coated glass, ITO-coated polyimide or other plastics, aluminum or other metals alone or coated on a polymer or other substrate, a doped polythiophene, various flexible plastics, and the like.

A dielectric component of this invention can be selected from various materials providing favorable capacitance and/or insulating properties. The dielectric component can be prepared from inorganic dielectric materials such as various oxides (e.g., $SiO_2$, $Al_2O_3$, $HfO_2$), nitrides (e.g., $Si_3N_4$), organic dielectric materials such as various polymeric materials (e.g., polycarbonate, polyester, polystyrene, polyhaloethylene, polyacrylate), and self-assembled superlattice/self-assembled nanodielectric (SAS/SAND) materials. (e.g., described in U.S. patent application Ser. No. 11/181,132, Yoon et al., PNAS, 102 (13): 4678-4682 (2005), the entire disclosure of each of which is incorporated by reference herein), as well as hybrid organic/inorganic dielectric materials (e.g., described in U.S. patent application Ser. No. 11/642,504, the entire disclosure of which is incorporated by reference herein). In some embodiments, the dielectric component can include the crosslinked polymer blends described in U.S. patent application Ser. Nos. 11/315,076, 60/816,952, and 60/861,308, the entire disclosure of each of which is incorporated by reference herein.

In various embodiments, the dielectric component can be prepared by depositing a fluid medium comprising the dielectric material or a precursor thereof, on either the substrate component (for bottom gate devices) or the semiconductor component (for top gate devices) by various solution-phase methods. For example, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin-coating, drop-casting, zone casting, dip coating, blade coating, spraying, rod coating, or stamping. In some embodiments, the dielectric component may be cured by heating and/or irradiation.

In certain non-limiting embodiments, such a dielectric component can comprise a SAND multi-layered organic or metal-organic assembly/composition having periodically alternating layers of different materials. These alternating layers can include one or more layers comprising a π-polarizable moiety ("a choromophore layer"), or one or more layers comprising a metal oxide or some other inorganic materials, and one or more layers comprising a silyl or siloxane moiety ("an organic layer"). At least some of the alternating layers can be coupled by a coupling or capping layer comprising a siloxane matrix. (See, e.g., without limitation, FIG. 1.)

The π-polarizable moiety can include conjugated π-electrons. In some embodiments, the π-polarizable moiety can include at least one of a dipole moment, an electron releasing moiety, an electron withdrawing moiety, a combination of such moieties, a zwitterion and a net charge. Without limitation, such a component can comprise a non-linear optical (NLO) chromophore. In some embodiments, the chromophore can include a π-conjugated system, which can include a system of atoms covalently bonded with alternating single and multiple (e.g., double) bonds (e.g., C=C—C=C—C and C=C—N=N—C). The π-conjugated system can include heteroatoms such as, but not limited to, nitrogen (N), oxygen (O), and sulfur (S). In some embodiments, the π-conjugated system can include one or more aromatic rings (aryl or heteroaryl) linked by conjugated hydrocarbon chains. In certain embodiments, the aromatic rings can be linked by conjugated chains that include heteroatoms (e.g., azo groups [—N=N—]). For example, the π-polarizable moiety can be a chromophore that includes a stilbazolium moiety. The identity of such compounds are limited only by their electronic/ structural features and resulting polarizability in the context of a particular use or application, as illustrated by various representative embodiments described herein.

The organic layers can include a bis(silylated) alkyl moiety (e.g., ranging from about $C_1$ to about $C_{20}$). In particular embodiments, the organic layers can be coupled to the chromophore layers directly or via a coupling or capping layer that includes a siloxane matrix. The coupling can be performed via a condensation reaction or chemisorption using known silyl chemistry. For example, precursors of the silyl moiety and the siloxane moiety can include hydrolyzable groups such as, but not limited to, halo groups, amino groups (e.g., dialkylamino groups), and alkoxy groups. Examples of such precursors can include, but are not limited to, $Cl_3Si(CH_2)_nSiCl_3$, $(CH_3O)_3Si(CH_2)_nSi(OCH_3)_3$, and $(Me_2N)_3Si(CH_2)_nSi(NMe_2)_3$, where n can be an integer in the range of 1-10 (i.e., n can be 1, 2, 3, 4, 5, 6, 7, 8, 9, or 10). As discussed more fully herein, such groups are hydrolyzable to a degree sufficient for substrate sorption or condensation or intermolecular crosslinking via siloxane bond formation under the processing or fabrication conditions employed. Similarly, the π-polarizable moiety can be derivatized to include similar silyl hydrolyzable groups, to allow bond formation with the siloxane capping layer and/or the organic layer. In particular embodiments, the organic layers and the chromophore layers can be individually self-assembled monolayers that include the silyl or siloxane moiety, or the π-polarizable moiety.

In some embodiments, the dielectric component can comprise at least one organic dipolar layer comprising a compound comprising a π-polarizable moiety covalently bonded to or cross-linked with a siloxane bond sequence. In certain embodiments, such a dielectric component can comprise a hydrocarbon layer coupled with silicon-oxygen bonds to such a dipolar layer. In certain other embodiments, such a dielectric component can further comprise at least one siloxane capping layer coupled to such a dipolar layer, with silicon-oxygen bonds. Regarding such embodiments, a siloxane capping layer can be positioned between a dipolar layer and a hydrocarbon layer, coupled to each with silicon-oxygen bonds. Such components are described more fully in co-pending application Ser. No. 11/181,132, filed Jul. 14, 2005, the entirety of which is incorporated herein by reference.

Such a silicon-oxygen bonding sequence can be the condensation product of a hydrolyzable silicon moiety (e.g., without limitation, a halogenated, alkoxylated and/or carboxylated silyl moiety) and a hydroxyl functionality. As understood in the art and explained more fully in one or more of the references incorporated herein, such a bonding sequence can derive from use of starting material compounds for the respective dielectric layers, such compounds substituted with one or more hydrolyzable silicon moieties, hydrolysis of such a moiety under self-assembly conditions, and condensation with a subsequent layer starting material or precursor compound.

Precursor compounds which can be incorporated into such layers can include, for instance, bis-trichlorosilyloctane, octachlorotrisiloxane and 4-[[(4-(N,N-bis((hydroxy)ethyl) amino]-phenyl]azo]-1-(4-trichlorosilyl)benzyl-pyridinium iodide, such compounds condensed one with another, with corresponding layers assembled to provide dielectric components in accordance with this invention.

While several of the aforementioned dielectric component compounds, layers and moieties are illustrated in the aforementioned incorporated reference, various other component compounds and associated moieties are contemplated within the scope of this invention, as would be understood by those skilled in the art made aware thereof. For instance, without limitation, various other π-polarizable component compounds and associated moieties are described in U.S. Pat. No. 6,855,274, in particular the NLO structures of FIGS. 1-2, 11, 13 and 15 thereof, U.S. Pat. No. 6,549,685, in particular FIGS. 2-3 thereof, and U.S. Pat. No. 5,156,918, in particular the structures of FIGS. 4-5 thereof, each with reference to the corresponding specification regarding alternate embodiments synthesis and characterization, each of which is incorporated herein by reference in its entirety. Further, as would be understood by those skilled in the art, various other non-linear optical chromophore compounds are described in "Supramolecular Approaches to Second-Order Nonlinear Optical Materials. Self-Assembly and Microstructural Characterization of Intrinsically Acentric [(Aminophenyl)azo]pyridinium Superlattices", Journal of American Chemical Society, 1996, 118, 8034-8042, which is hereby incorporated by reference in its entirety. Such layer component compounds can be used, as described herein, with a variety of difunctionalized hydrocarbon layer and/or siloxane capping layer component compounds, such compounds without limitation as to hydrocarbon length or degree of functionalization capable of condensation with a suitable substrate and/or various other dielectric layers or components in accordance with this invention.

In certain embodiments, the multi-layer dielectric component also can include one or more layers that include an inorganic moiety ("an inorganic layer"). The inorganic layers can periodically alternate among the organic layers and the chromophore layers, and can include one or more main group/transition metal compounds, for example, main group or transition metals selected from a Group 3 metal, Group 4 metal, Group 5 metal and a Group 13 metal. In certain embodiments, the main group metals can be selected from a Group 3 metal such as, but not limited to, yttrium (Y), a Group 4 metal such as, but not limited to, titanium (Ti), zirconium (Zr), and hafnium (Hf), a Group 5 metal such as, but not limited to, tantalum (Ta), and a Group 13 metal such as, but not limited to, gallium (Ga), indium (In), and thallium (Tl) etc.

In certain other embodiments, the dielectric component can comprise a dielectric polymeric component and optionally a silylated component comprising a moiety, e.g., an alkyl group or a haloalkyl group, linking two or more silyl groups having hydrolyzable moieties. Various other linking moieties will be recognized in the art, limited only by structure or functionality precluding intermolecular siloxane bond and matrix formation. The range of the hydrolyzable silyl groups will be known by those skilled in the art made aware of this invention, and include but are not limited to groups such as trialkoxysilyl, trihalosilyl, dialkoxyhalosilyl, dialkylhalosilyl, dihaloalkylsilyl and dihaloalkoxysilyl. Such polymeric compositions are described more fully in co-pending U.S. patent application Ser. No. 11/315,076, filed Dec. 22, 2005, the entirety of which is incorporated herein by reference.

In certain such non-limiting embodiments, a bis(silylated) component can comprise an alkyl moiety ranging from about $C_1$ to about $C_{20}$, linking two trihalosilyl groups, two trialkoxysilyl groups or a combination thereof. As discussed more fully herein, such groups are hydrolyzable to a degree sufficient for substrate sorption or condensation or intermolecular crosslinking via siloxane bond formation under the processing or fabrication conditions employed. Regardless, the polymeric component of such compositions can be selected from a range of such dielectric polymers otherwise used in the art as separate gate insulator materials or layers in TFT fabrication. For purpose of example only, dielectric polymers can include poly(vinylphenol), polystyrene and copolymers thereof. In some embodiments, such polymeric compositions can be crosslinked. Such compositions of this invention are limited only by the availability of suitable silylated components and polymeric dielectric components, the mixture or miscibility thereof one with another for device fabrication, and the resulting polymer-incorporated siloxane-bonded matrix/network and corresponding dielectric/insulator function.

The composite also can include one or more electrical contacts. Suitable materials for the source, drain, and gate electrodes include metals (e.g., Au, Ag, Al, Ni, Cu), transparent conducting oxides (e.g., ITO, IZO, ZITO, GZO, GIO, GITO), and conducting polymers (e.g., poly(3,4-ethylenedioxythiophene) poly(styrenesulfonate) (PEDOT:PSS), polyaniline (PANI), polypyrrole (PPy)).

Without limitation, one aspect of the invention can be directed to a TFT device that includes a substrate (including a substrate-gate material such as, but not limited to, doped-silicon wafer, tin-doped indium oxide on glass, tin-doped indium oxide on mylar film, and aluminum on polyethylene terephthalate), a dielectric material as described herein deposited on the substrate/substrate-gate, a semiconductor material deposited on the dielectric material, and source-drain contacts. In some embodiments, the TFT can be a transparent TFT including one or more of the following: a transparent or substantially transparent substrate, a transparent or substantially transparent gate conductor, a transparent or substantially transparent inorganic semiconductor component, a transparent or substantially transparent dielectric component, and transparent or substantially transparent source and drain contacts. As used herein, "transparent" refers to having at least a 90% transmittance in the visible region of the spectrum, and "substantially transparent" refers to having at least 80% transmittance in the visible region of the spectrum.

In certain embodiments, the present teachings can relate to high-performance inorganic-organic hybrid TFTs fabricated, for example, with solution-processed polycrystalline metal oxide semiconducting thin-films (e.g., $In_2O_3$) as the channel material and a range of thin organic dielectrics. In other embodiments, the present teachings can relate to TFTs incorporating inorganic dielectrics such as but not limited to $SiO_2$. As shown below, it was found that inorganic crystalline semiconductor components with sufficient microstructural crystallinity can exhibit n-type field-effect behavior, and thin organic (or inorganic) dielectric components with sufficient insulating properties can enable ultra-low-voltage TFT operation. Such hybrid TFTs can show exceptionally large field-effect mobilities of >40 $cm^2$/V s at low operating voltages (1~2 V).

Various other substrates, organic dielectrics, inorganic semiconductors and transistor device configurations useful in conjunction with this invention are described in co-pending application Ser. No. 11/642,217 filed on Dec. 20, 2006, the entirety of which is incorporated herein by reference.

In addition to transistor devices such as thin film transistors, the solution-processed semiconductor component described herein, whether or not coupled to a dielectric component, can be embodied within various organic electronic, optical, and optoelectronic devices such as sensors, capacitors, unipolar circuits, complementary circuits (e.g., inverter circuits), ring oscillators, and the like.

BRIEF DESCRIPTION OF DRAWINGS

It should be understood that certain drawings are not necessarily to scale, with emphasis generally being placed upon illustrating the principles of the present teachings. The drawings are not intended to limit the scope of the present teachings in any way.

FIG. 6 shows AFM images of CBD CdSe films grown on the indicated substrates and annealed at 400° C.: A. $p^+$-Si/$SiO_2$ and B. $n^+$-Si/SAND substrates.

FIG. 16 shows the optimum transmittance spectrum (A) and derivation of the bandgap (B) of ITO film spin-coated on glass substrates and annealed at 250° C.

FIG. 17F plots mobility and current on/off ratio against annealing temperature. FIG. 17E plots mobility and current on/off ratio against different ratios of [In$^{3+}$] to [In$^{3+}$+Sn$^{4+}$].

FIG. 18 shows typical transfer (left) and output (right) plots for representative ITO-based TFTs having the structure of Si/SAND/ITO/Au, L=100 µm, W=500 µm, with the ITO films prepared from a precursor solution having a ratio of [In$^{3+}$] to [In$^{3+}$+Sn$^{4+}$]~7, and annealed at 250° C.

DETAILED DESCRIPTION OF CERTAIN EMBODIMENTS

Certain non-limiting, representative embodiments of this invention can be highlighted to demonstrate the exceptional thermal robustness of SAND dielectric materials and their unique surface chemical characteristics. For instance, in accordance with these and other such considerations, various aspects of this invention can be illustrated by solution-processed SAND/CdSe hybrid TFTs with $\mu_{FET}$s values as high as 57 cm$^2$ V$^{-1}$ s$^{-1}$ and operation at <5 V. Related thereto, the chemical bath deposition (CBD) method is a common scalable technique for fabricating inorganic thin films from aqueous soluble precursors. Since both the Hall and field-effect mobilities of CdSe (up to 800 cm$^2$ V$^{-1}$ s$^{-1}$) substantially exceed that of Si, this material has been recognized as a promising candidate semiconductor for inorganic TFTs. The most common CBD method for growing CdSe thin films employs aqueous Cd$^{2+}$ and sodium selenosulfate (SeSO$_3^{2-}$) solutions. An advantage is that CdSe film deposition parameters on hydroxylated surfaces have been investigated, and this information can be used for CdSe growth on n$^+$-Si/SAND substrates.

More specifically, bottom-gate/top-contact CdSe-based TFTs were fabricated on both commercial p$^+$-Si/(300 nm) SiO$_2$ (control) and n$^+$-Si/(16.5 nm) SAND substrates following identical CBD procedures for CdSe film growth. The general procedure for SAND film fabrication on Si/SiO$_2$ substrates was reported previously in the literature and is described in one or more of the aforementioned incorporated references. Briefly, the substrate can be immersed in a solution comprising a precursor for preparing the organic layer (e.g., Cl$_3$Si(CH$_2$)$_8$SiCl$_3$). After removal of excess reagents, the substrate coated with the organic layer can be immersed in a solution comprising the capping agent (e.g., Si$_3$O$_2$Cl$_8$) to provide a siloxane matrix. Again, after removal of excess reagents, the substrate coated with the organic layer and the capping agent can be immersed in a solution comprising the 21-polarizable moiety (e.g., a Stbz chromophore precursor). These steps can be repeated to grow a SAND multilayer dielectric of the desired thickness.

Figure 2:
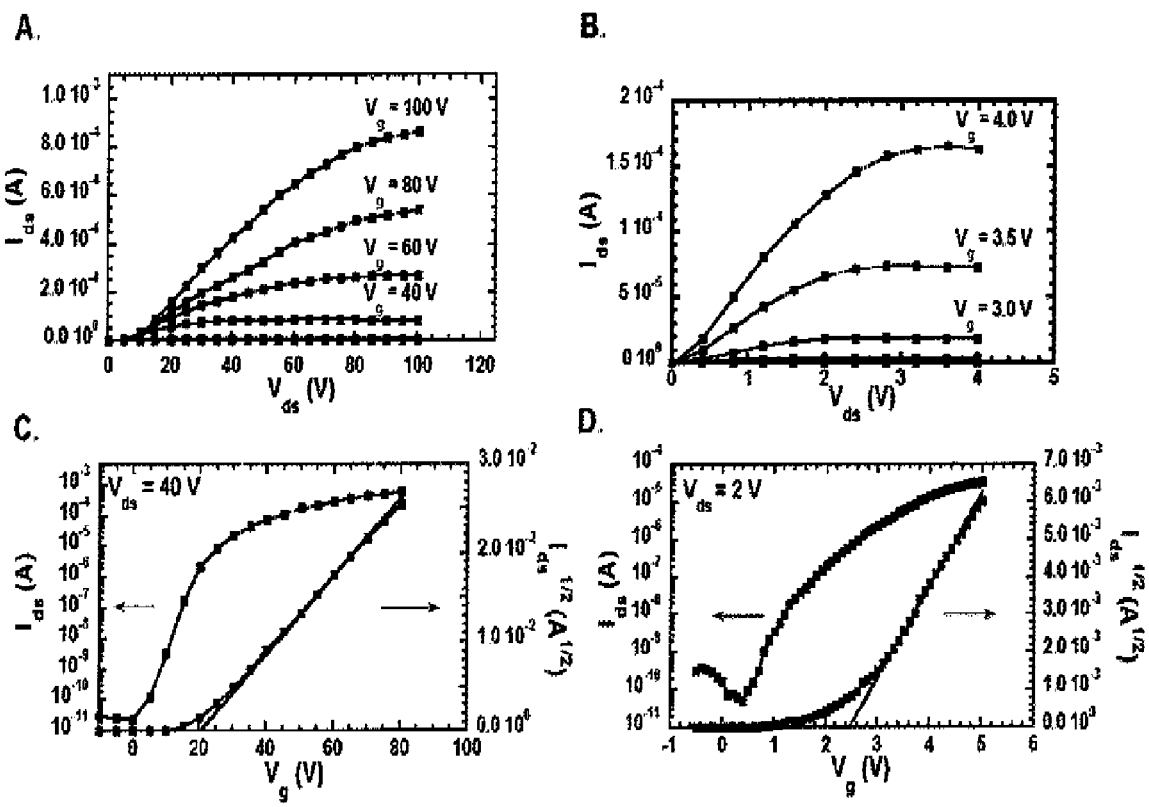
FIG. 2 shows representative transfer and output I-V plots for TFTs having the structures: $p^+$-Si/$SiO^2$/CdSe/Au (A and C) and $n^+$-Si/SAND/CdSe/Au (B and D).

After annealing the CdSe films at various temperatures, TFT fabrication was completed by thermal evaporation of Au source and drain contacts (50 nm) through a shadow mask. Device parameters were extracted from I-V plot analysis, and field-effect mobilities were calculated in saturation using eq (1):

$$I_{ds}=(W/2L)\mu C_i(V_g-V_{th})^2 \tag{1}$$

where L is the channel length, W is the channel width, $C_i$ is the capacitance per unit area of the dielectric film, µ is the field effect mobility of the semiconductor, $V_{th}$ is the threshold voltage, and $V_g$ is the gate voltage. FIG. 2 shows representative transfer and output I-V plots. For control devices on SiO$_2$, CdSe films annealed at 300° C. for 5 min in vacuum and the ambient and yielded TFTs exhibiting an average $\mu_{FET}$ of ~1.3 (±1.1) cm$^2$ V$^{-1}$ s$^{-1}$ with a maximum observed $\mu_{FET}$ of ~3.0 cm$^2$ V$^{-1}$ s$^{-1}$ CdSe films annealed at 400° C. under the same conditions afford devices exhibiting an average $\mu_{FET}$ of ~4.0 (±2.0) cm$^2$ V$^{-1}$ s$^{-1}$ with a maximum $\mu_{FET}$ of ~6.7 cm$^2$ V$^{-1}$ s$^{-1}$ (FIGS. 2A and 2C). The average $V_{th}$, the subthreshold slope (S), and the SiO$_2$-based $I_{on}/I_{off}$ for the devices annealed at 400° C. were +25 V, 3.4 V dec$^{-1}$, and 10$^6$, respectively. These $\mu_{FET}$ values are approximately an order of magnitude lower than previously reported for CBD CdSe/SiO$_2$ TFTs with Al source and drain electrodes. Since these are n-channel TFTs, the low work function of Al versus Au may reduce metal-semiconductor contact resistance, enhancing electron injection and therefore observed mobilities. Nevertheless, these mobility values are greater than those of TFTs fabricated with ink-jetted CdSe films which exhibited a maximum mobility of 1 cm$^2$ V$^{-1}$ s$^{-1}$. The semiconductor growth area was next patterned with polystyrene or polymethyl methacrylate masking to increase the $I_{on}/I_{off}$ ratio and device yield. This procedure increases the SiO$_2$/CdSe TFT $I_{on}/I_{off}$ ratio to 10$^7$ and device yields to >70% with comparable mobilities. When different channel lengths/widths are utilized, the observed drain currents scale linearly with the device dimensions, demonstrating excellent film uniformity and low parasitic leakage currents.

Figure 3:
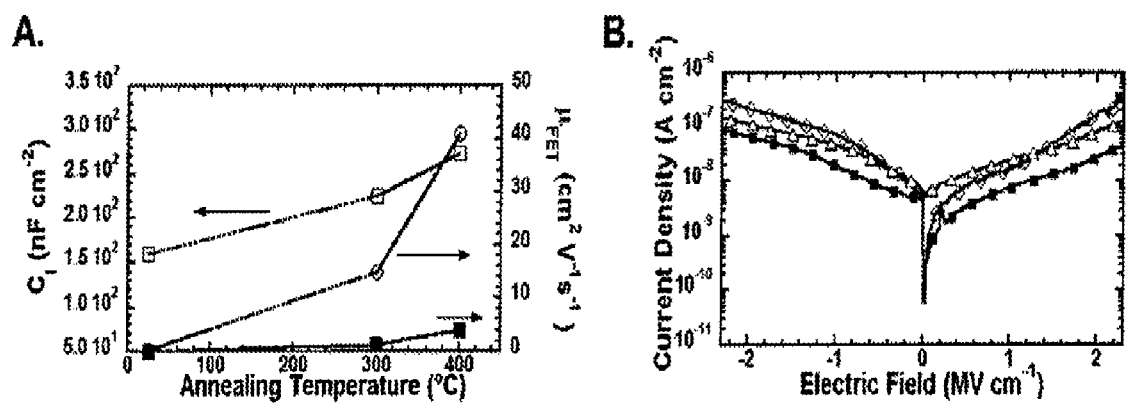
FIG. 3A shows a plot of the capacitance and average $\mu_{FET}$ versus annealing temperature.
FIG. 3B shows current density-electrical field plots for MIS capacitors of structure: Au/SAND (16.5 nm)/$n^+$-Si before (◇) and after [■ (300° C.), ▲ (400° C.)] annealing at the indicated temperatures for 15 min.
FIG. 3C shows current density-applied potential plots for MIS capacitors of structure: Au/SAND (16.5 nm)/$n^+$-Si before (◇) and after [■ (300° C.), ▲ (400° C.)] annealing at the indicated temperatures for 15 min under an ambient atmosphere.
Figure 3C:
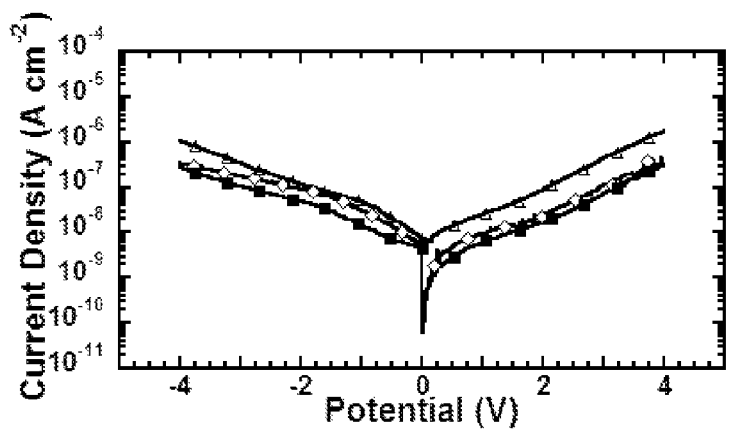

Prior to SAND-based TFT fabrication, the thermal stability of the SAND dielectrics under CdSe annealing conditions was investigated in metal (Au)-insulator (SAND)-semiconductor (Si) capacitor structures. n+-Si/SAND substrates were thermally annealed at various temperatures for 15 min in air and Au dot contacts then thermally evaporated through a shadow mask (200 μm×200 μm). Next, the leakage current density ($J_{leak}$) vs. voltage and capacitance vs. voltage (or frequency) of the control (pristine) and thermally annealed samples were measured in the same bias window (−4 to +4 V, FIG. 3). Compared to the control sample (−0.3 μA cm$^{-2}$ at 4 V), the SAND $J_{leak}$ does not vary after annealing at 300° C., and only 4× for annealing at 400° C. in air (~1.1 μA cm$^{-2}$ at 4 V, FIG. 3C). The capacitance of the SAND films likewise increases significantly as the annealing temperature is increased, from 160 (control) to 225 (300° C.) to 274 nF cm$^{-2}$ (400° C.; FIG. 3A). The details of this capacitance increase are not fully described herein; however, preliminary X-ray reflectivity (XRR) measurements suggest film densification and thinning upon thermal annealing, possibly due to further silanol condensation with $H_2O$ elimination. Note that under these annealing conditions Si does not form any additional $SiO_2$ coating. Therefore, the capacitance variance is reasonably associated with the decreased SAND film thickness. Consequently, the $J_{leak}$ increase at 400° C. for the same bias window may simply reflect the film thickness reduction. FIG. 3B plots the leakage current density versus electric field, demonstrating that SAND $J_{leak}$ decreases for the annealed films. These results provide clear evidence that the SAND films exhibit remarkable thermal and dielectric stability under ambient, rendering them suitable for high-temperature inorganic film growth/annealing.

Given the excellent SAND thermal stability, SAND/CdSe TFT fabrication was carried out. FIG. 3A shows the average CdSe film $\mu_{FET}$ versus annealing temperature. Typical patterned SAND/CdSe devices annealed at 400° C. exhibit an average $\mu_{FET}$=41 (±15) cm$^2$ V$^{-1}$ s$^{-1}$ with a maximum observed $\mu_{FET}$ of ~5.7 cm$^2$ V$^{-1}$ s$^{-1}$. The $I_{on}/I_{off}$ ratio is typically ~10$^4$ with a maximum of ~10$^5$, and typical subthreshold slopes are 0.26 V dec$^{-1}$. TFTs annealed at 300° C. exhibit larger saturated mobility distributions characterized by nearly the same maximum $\mu_{FET}$ but a lower average mobility of 15 (±11) cm$^2$ V$^{-1}$ s$^{-1}$. The $V_{th}$ for these devices is ≦+3.0 V. The gate leakage current is 1-2 orders of magnitude lower than $I_{ds}$. Overall, the mobilities obtained from SAND devices are significantly larger than those of the p+-Si/SiO$_2$/CdSe devices, and the devices perform at substantially lower operating voltages. (Field-effect mobility enhancements on going from SiO$_2$ to SAND-based TFTs has been observed before for inorganic semiconductors such as GaAs and In$_2$O$_3$ films and for oxide nanowires.) Table 1 summarizes TFT data for the present CBD CdSe-based TFTs with various dielectrics and annealing temperatures. The p+-Si/SiO$_2$/CdSe substrates that were not annealed did not exhibit current modulation.

Figure 4:
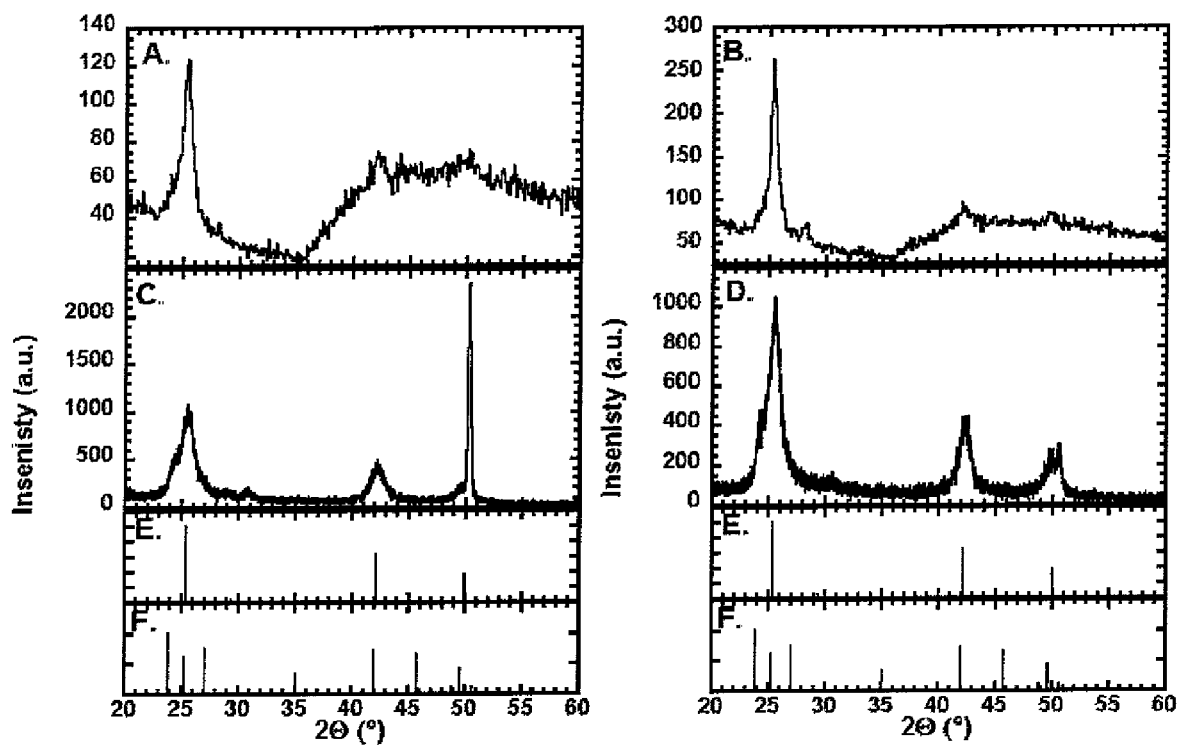
FIG. 4 shows XRD θ-2θ (A and B) and GIXD (grazing incidence X-ray diffraction) with ω=0.33° (C and D) scans of CBD CdSe films grown on the indicated substrates and annealed at 400° C.: $p^+$-Si/$SiO_2$ (A and C) and $n^+$-Si/SAND (B and D). Tabulated powder diffraction patterns from the powder diffraction file (PDF) for cubic (E; PDF #65-2891) and hexagonal (F; PDF #65-3436) CdSe are plotted below the XRD and GIXD scans.
Figure 5A:
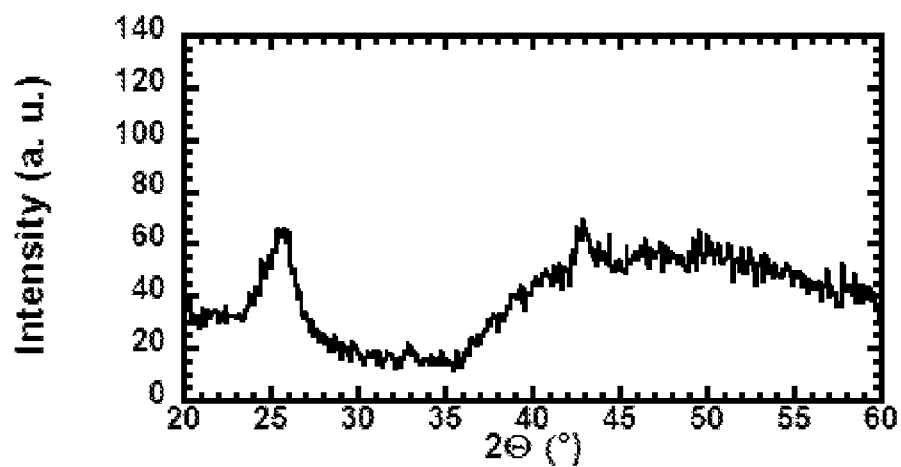
FIG. 5A shows XRD θ-2θ of a CBD CdSe film grown on $p^+$-Si/$SiO_2$ before the film was annealed.
Figure 5B:
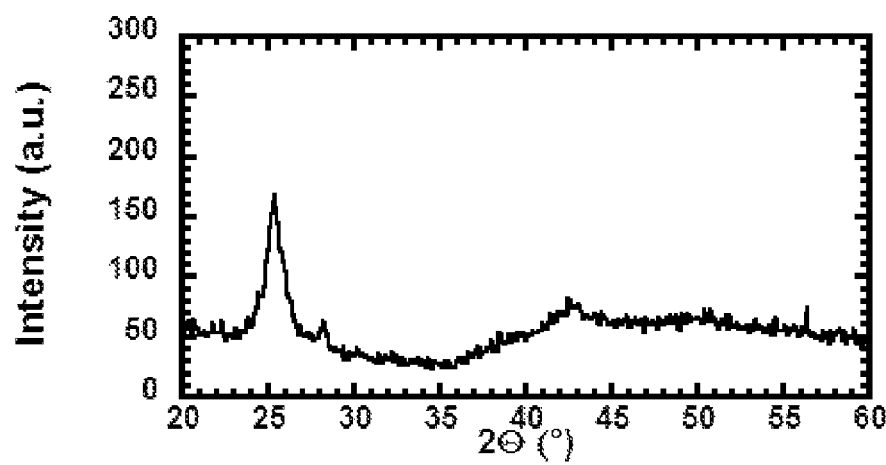
FIG. 5B shows XRD θ-2θ of a CBD CdSe film grown on $n^+$-Si/SAND before the film was annealed.

To understand whether the enhanced SAND/CdSe versus SiO$_2$/CdSe TFT performance has a microstructured origin, X-ray diffraction (XRD) experiments were performed on the CdSe films deposited by CBD on both p+-Si/SiO$_2$ and n+-Si/SAND substrates then annealed at 400° C. (FIG. 4). The θ-2θ XRD analysis reveals that for the pristine (FIGS. 4-5) and annealed CBD CdSe films grown on both p+-Si/SiO$_2$ and n+-Si/SAND substrates, only one feature at 2θ≈25.4° is observed. Under these deposition conditions, it is expected that the CdSe will be deposited as a mixture of hexagonal and cubic phases, and the feature at 2θ≈25.4° can be attributed to the (111) reflection from the sphalerite cubic (zinc blende structure) and/or the (002) reflection of the hexagonal (wurtzite-structure) phase. Interestingly, the glancing incidence X-ray diffraction (GIXD) analysis of the CdSe film in proximity to the surface reveals a diffraction pattern most consistent with the cubic phase. Annealing at 300-400° C. for 5 min significantly improves film crystallinity but does not lead to complete conversion to the hexagonal phase. While longer annealing times should lead to a full conversion to the hexagonal phase, reduction in the grain boundaries with short annealing periods is sufficient to produce acceptable present $\mu_{FET}$ values, and the $\mu_{FET}$ values do not significantly increase with annealing times up to one hour. The hexagonal phase, under certain conditions, is associated with lower electrical resistivity and bandgap values, although the reported differences between vacuum-deposited cubic or hexagonal phase CdSe film mobilities are negligible. However, since the cubic CdSe is metastable, this improvement in performance may also be due to annealing effects which reduce the grain boundary density. Using full-width at half-maximum analysis of the 2θ≈25.4° reflection and the Debye-Scheirer formula, the average crystallite size for the present CBD CdSe films grown on SiO$_2$ is ~5 nm while the average crystallite size on n+-Si/SAND is ~7 nm. Tapping mode AFM images (FIG. 6) confirm the polycrystalline nature of the present CdSe films which exhibit rms roughnesses of ~20-70 nm for both substrates. The images also show larger grain sizes for the CdSe than do the X-ray measurements. The cause of this discrepancy may be due to the fact that AFM is a resolution and surface-limited method. The film thickness was ~200 nm for both substrates.

As described, this invention provides the first fabrication of TFTs using a solution-processed inorganic semiconductor combined with a solution-processed organic gate dielectric. The field-effect mobilities demonstrated here are as high as 57 cm$^2$V$^{-1}$ s$^{-1}$ with large $I_{on}/I_{off}$ ratios (10$^5$) and a subthreshold slopes as low as 0.26 V dec$^{-1}$. Such performance parameters should make these devices attractive for a wide variety of applications. Such TFT results represent an important step

TABLE 1

Summary of CBD CdSe-based TFT performance measured in the ambient.

| Device Structure | Annealing Temp. (° C.) | $\mu_{FET}$ (cm$^2$V$^{-1}$s$^{-1}$)[a] | $I_{on}/I_{off}$[a] | $V_{th}$ (V) | S (V dec$^{-1}$) |
|---|---|---|---|---|---|
| n+-Si/SAND/CdSe | 25 (no anneal) | 0.34 | 10$^3$ | 3.8 | 0.65 |
| p+-Si/2/CdSe | 300 | 1.3 ± 1.1 (3.0) | 10$^5$ (10$^6$) | +30 | 5.0 |
| n+-Si/SAND/CdSe | 300 | 15 ± 11 (29) | 10$^4$ (10$^5$) | +3.0 | 0.30 |
| p+-Si/SiO$_2$/CdSe | 400 | 4.0 ± 2.0 (6.7) | 10$^6$ (10$^7$) | +25 | 3.4 |
| n+-Si/SAND/CdSe | 400 | 41 ± 15 (57) | 10$^5$ (10$^6$) | +2.5 | 0.26 |

[a]Values in the parentheses are the maximum recorded.

forward in large-area electronics fabrication, especially considering the simplicity of the semiconductor and dielectric film deposition methods.

Certain non-limiting, representative embodiments of this invention can be highlighted to demonstrate the exceptional properties attributable to the solution-processed inorganic semiconductor component according to the present invention. For instance, in accordance with these and other such considerations, various aspects of this invention can be illustrated by various indium oxides prepared from a precursor solution according to the present invention.

Figure 7:
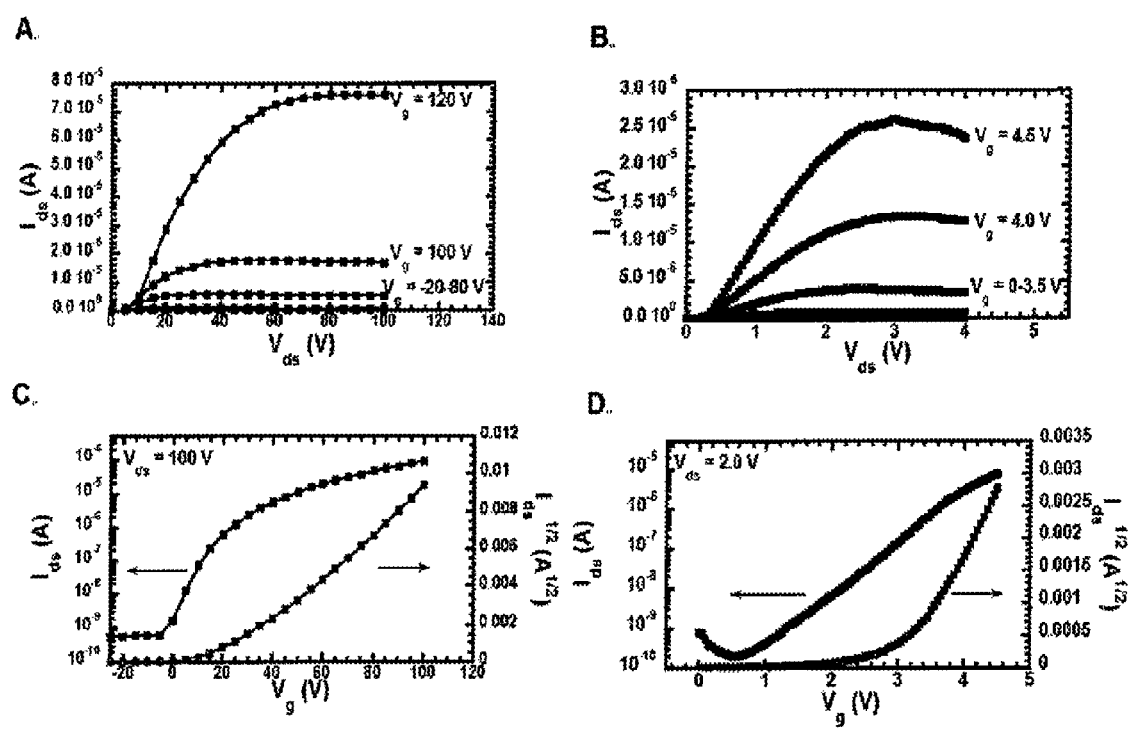
FIG. 7 shows current-voltage output (A and B) and transfer (C and D) plots for TFTs having the structures: $p^+$-Si/$SiO_2$/ZIO/Au (A and C) and $n^+$-Si/SAND/ZIO/Au (B and D).

Indium oxide ($In_2O_3$) is an n-type oxide semiconductor with a wide band gap (3.6 eV) having a complex cubic bixbyte crystal structure with a lattice parameter a=10.11 Å. The coexistence of high optical transmittance in the visible region, high carrier mobility, and tunable conductivity makes $In_2O_3$ a candidate for applications in TFTs, solar cells, and other opto-electronic devices. Thin films of $In_2O_3$ are superior to other transparent oxide counterparts such as ZnO, CdO, and $SnO_2$, largely due to their high mobility of 10-75 $cm^2V^{-1} s^{-1}$ at a carrier density of $\sim 10^{19}$-$10^{20}$ $cm^3$. However, high-quality $In_2O_3$ thin films are currently grown by vacuum-based physical vapor deposition processes such as ion-assisted deposition, which are expensive to scale for large areas and high throughput. To the inventors' knowledge, there has been no report of solution-processed $In_2O_3$ thin film transistors with satisfactory performance. Accordingly, in accordance with various other embodiments of this invention, films of zinc indium oxide (ZIO) were spun-cast onto the SAND dielectric to demonstrate the wide applicability of SAND to other solution-processed inorganic semiconductors. The ZIO films spun cast onto 300 nm $SiO_2$ substrates had $\mu_{FET}$ of $\sim 0.60$ $cm^2$ $V^{-1}$ $s^{-1}$, $I_{on}/I_{off}$ of $10^5$, $V_{th}$ equal to 30 V and a S equal to 8.0 V $dec^{-1}$. The ZIO films spun cast onto SAND substrates had $\mu_{FET}$ of $\sim 7.2$ $cm^2$ $V^{-1}$ $s^{-1}$, $I_{on}/I_{off}$ of $10^4$, $V_{th}$ equal to 3.3 V and a S equal to 1.0 V $dec^{-1}$. These results again demonstrate the improved performance of a solution-processed inorganic semiconductor when the gate dielectric of the device is switched from $SiO_2$ to SAND (FIG. 7).

EXAMPLES OF THE INVENTION

The following non-limiting examples and data illustrate various aspects and features relating to the methods and devices of the present invention, including the assembly of thin film transistor devices, as are available through the fabrication techniques described herein. In comparison with the prior art, the present methods and devices provide results and data which are surprising, unexpected and contrary thereto. While the utility of this invention is illustrated through the use of several device structures and inorganic semiconductor components used therewith, it will be understood by those skilled in the art that comparable results are obtainable with various other devices and related methods and semiconductor components, as are commensurate with the scope of this invention.

Example 1a

CdSe Film Deposition

The reagents $CdCl_2$, Se, and $Na_2SO_3$ were purchased from Aldrich Chemicals and were used without further purification. The aqueous ammonia (28-30%) solution was purchased from Mallinckrodt Baker. The water used in all the deposition steps was purified with a Millipore nanopure water system. The $Na_2SeSO_3$ solution was prepared from 0.37 g (4.7 mmol) of Se in 40 mL of a 0.2 M (7.9 mmol) $Na_2SO_3$ solution which was heated at 60° C. for 1.5 h in a water bath to from the $Na_2SeSO_3$. The undissolved Se was then removed by filtration with filter paper and resulting filtrate used in the CBD solution. The CBD solution was prepared from 20 mL of ~0.1 M aqueous $CdCl_2$, 6.0 ml concentrated $NH_4OH$, and 20 mL of ~0.1 M aqueous $Na_2SeSO_3$ solution. This solution was then heated to 80° C. using a water bath. After the solution became orange, the substrates (7×2.5 cm) loaded into a glass holder and were immersed in the CBD solution. The substrates were initially placed in the solution for 1 min, then rinsed with de-ionized water and this step was repeated twice. After these initial surface conditioning steps, the substrates were re-immersed in the solution for ~15 min. After the film deposition, the substrates were sonicated in fresh de-ionized water threes times for 5 min, then air dried before annealing. The typical CdSe film thickness was between 160-200 nm.

Example 1b

For patterning of the semiconductor film growth, solutions of the polystyrene ($M_w$=250 K) and polymethyl methacrylate (350 K) were brushed onto the substrates to define deposition regions on the Si substrate. The concentration of the polymer solutions was 100 mg/mL in toluene and TFT for polystyrene and polymethyl methacrylate, respectively. After 20 min of air drying, the patterned substrates were heated (65° C.) under vacuum for 1 h. CBD of the CdSe was then performed. Following the nanopure water washings, the CdSe coated substrates were sonicated three times in 50 mL of THF for 5 min and subsequently washed twice in nanopure water for 5 min. This procedure results in ~12 $mm^2$ patterned CdSe films.

Example 2

Zinc Indium Oxide Film Deposition

A 0.1 M solution of zinc acetate ($Zn(OAC)_2$) in 2-methoxy-ethanol was prepared. The compound 2-amino-ethanol was added to the solution in a 1:1 ratio with the $Zn(OAC)_2$ to increase the $Zn(OAC)_2$ solubility to afford a solution concentration of 0.1 M. A 0.1 M solution of $InCl_3$ in was also prepared 2-methoxy-ethanol. The spin-casting solution was prepared by mixing 0.5 ml of the $InCl_3$ solution and 0.5 ml of the $Zn(OAC)_2$ solution. The precursor film was then spun cast at 1500 rpm. The precursor film was then pre-annealed at 180° C. for 10 min and then a second coat of ZIO was spun-cast and pre-annealed the ZIO film was then annealed at 400° C. for 30 min.

Example 3

Film Characterization and TFT Fabrication and Measurements

Atomic force microscopic images were recorded in the tapping mode using a IEOL-5200 Scanning Probe Microscope with silicon cantilevers. The images were processed using the WinSPM software. Film thicknesses were measured with a Iencor model P10 surface profilometer. Wide angle θ-2θ X-ray diffractometry (WAXRD) of the CdSe films were performed with a Rigaku DMAX-A diffractometer using Ni-filtered Cu Kα radiation. Electrical measurements were performed with a Keithley 6430 Sub-Femtoamp Remote source meter and a Keithley 2400 source meter using a locally written LABVIEW program and general purpose interface bus communication. Impedance spectroscopy measurements were made with a Hewlett-Packard 4192A impedance spectrometer. TFT characterization was performed in the dark under ambient conditions. The saturation mobility was evaluated using eq (1) in the text. The saturation mobility calculation was performed with the slope of $I_{ds}^{1/2}$ vs. $V_G$ derived from the device transfer plot. A bottom gate/top contact TFT architecture was utilized. The Au (50 nm) source/drain contacts were deposited by thermal evaporation through shadow masks to afford the desired channel dimensions. SAND films were deposited following the procedure previously published, and as provided in the aforementioned incorporated references.

Example 4a

Indium chloride (99.9%, Sigma-Aldrich), 2-methoxy-ethanol (99%, Sigma-Aldrich), and 2-ethanolamine (99%, Sigma-Aldrich) were used as received without further purification. Seven vials (25 mL) were provided and a 10 mL aliquot of the 2-methoxyethanol solution of $InCl_3$ (0.1 mmol) was added into each vial. Various amounts of ethanolamine (0.0, 0.10, 0.50, 0.75, 1.0, 1.25, and 1.5 mmol, respectively) were then added to the 2-methoxyethanol solution of $InCl_3$ such that the ethanolamine:$In^{3+}$ molar ratio varied from 0.0 to 15, respectively. These clear solutions were stirred for 30 minutes at room temperature before spin-coating.

Example 4b

Indium chloride (99.9%, Sigma-Aldrich), 2-methoxy-ethanol (99%, Sigma-Aldrich), and diethanolamine (99%, Sigma-Aldrich) were used as received without further purification. Seven vials (25 mL) were provided and a 10 mL aliquot of the 2-methoxyethanol solution of $InCl_3$ (0.1 mmol) was added into each vial. Various amounts of diethanolamine (0.0, 0.05, 0.10, 0.25, 0.50, and 0.75 mmol, respectively) were then added to the 2-methoxyethanol solution of $InCl_3$ such that the ethanolamine:$In^{3+}$ molar ratio varied from 0.0 to 7.5, respectively. These clear solutions were stirred for 30 minutes at room temperature before spin-coating.

Example 4c

Indium chloride (99.9%, Sigma-Aldrich), 2-methoxy-ethanol (99%, Sigma-Aldrich), and propanolamine (99%, Sigma-Aldrich) were used as received without further purification. Seven vials (25 mL) were provided and a 10 mL aliquot of the 2-methoxyethanol solution of $InCl_3$ (0.1 mmol) was added into each vial. Various amounts of 3-propanolamine (0.0, 0.10, 0.50, 0.75, 1.0, and 1.25 mmol, respectively) were then added to the 2-methoxyethanol solution of $InCl_3$ such that the ethanolamine:$In^{3+}$ molar ratio varied from 0.0 to 12.5, respectively. These clear solutions were stirred for 30 minutes at room temperature before spin-coating.

Example 4d

Indium chloride (99.9%, Sigma-Aldrich), zinc acetate (99.9%, Sigma-Aldrich), 2-methoxy-ethanol (99%, Sigma-Aldrich), and ethanolamine (99%, Sigma-Aldrich) were used as received without further purification. Seven vials (25 mL) were provided and a 10 mL aliquot of the 2-methoxyethanol solution of $Zn(ac)_2$ (0.05 mmol) and $InCl_3$ (0.05 mmol) was added into each vial. Various amounts of ethanolamine (0.0, 0.10, 0.20, 0.30, 0.40, and 0.50 mmol, respectively) were then added to the 2-methoxyethanol solution of $Zn(Ac)_2$ and $InCl_3$ such that the ethanolamine:$(Zn^{2+}+In^{3+})$ molar ratio varied from 0.0 to 5.0, respectively. These clear solutions were stirred for 30 minutes at room temperature before spin-coating.

Example 4e

Indium chloride (99.9%, Sigma-Aldrich), tin chloride (99.9%, Sigma-Aldrich), 2-methoxy-ethanol (99%, Sigma-Aldrich), and ethanolamine (99%, Sigma-Aldrich) were used as received without further purification. Seven vials (25 mL) were provided and a 10 mL aliquot of the 2-methoxyethanol solution of $SnCl_4$ (0.05 mmol) and $InCl_3$ (0.05 mmol) was added into each vial. Various amounts of ethanolamine (0.0, 0.10, 0.20, 0.30, and 0.40 mmol, respectively) were then added to the 2-methoxyethanol solution of $SnCl_4$ and $InCl_3$ such that the ethanolamine:$(Sn^{4+}+In^{3+})$ molar ratio varied from 0.0 to 4.0, respectively. These clear solutions were stirred for 30 minutes at room temperature before spin-coating.

Example 5

Figure 1:
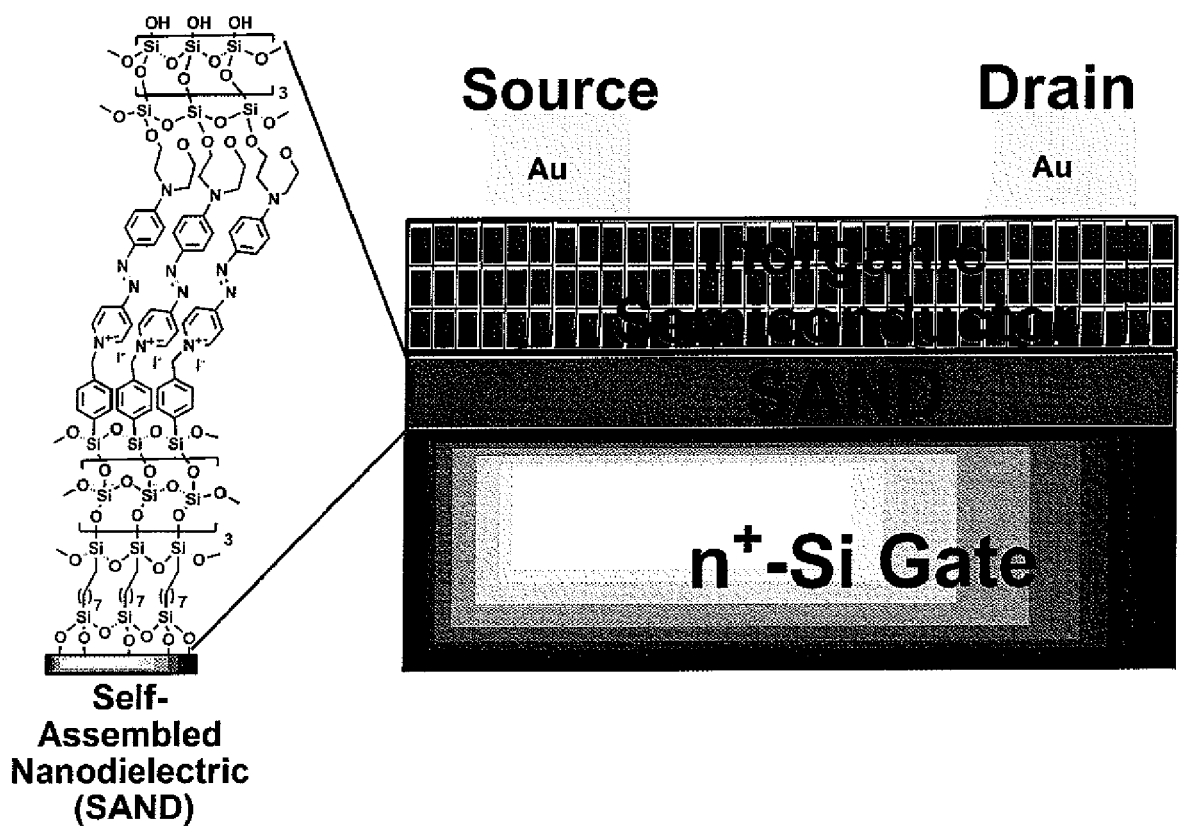
FIG. 1 shows an exemplary thin film transistor that can incorporate a solution-processed inorganic semiconductor component according to the present teachings (right). Also shown is the molecular structure of a representative organic nanoscopic dielectric (self-assembled nanodielectric (SAND)) and its component constituents that can be incorporated by solution processes into the same thin film transistor or similar device structures (left).

The metal oxide precursor formulations from Example 4 were spin-coated on a variety of substrates including glass, silicon wafers, and silicon substrates coated with an inorganic dielectric material (e.g., $SiO_2$) or an organic dielectric material (e.g., a self-assembled nanodielectric ("SAND") described in U.S. patent application Ser. No. 11/181,132). The molecular structure of a representative nanoscopic SAND dielectric and its component constituents is shown in FIG. 1. Silicon wafers (1 cm×2 cm) were sonicated with absolute ethanol and dried with $N_2$ stream followed by oxygen plasma treatment for 5 minutes. Similarly, dielectric-coated silicon substrates were rinsed with absolute ethanol and dried with an $N_2$ stream. The appropriate metal oxide precursor formulation was then spin-coated onto these substrates at the speed of 1500 rpm with an acceleration of 435 rpm/sec. Subsequently, the spin-coated films were annealed in a tubular furnace (e.g., heated to 400° C. for 10 minutes). After cooling to room temperature, the process was repeated to achieve the required film thickness. The SAND material was fabricated by established solution-phase-based growth techniques. The resulting films were smooth, and showed strong adhesion, good thermal stability, pin-hole-free morphology, and remarkable electrical insulating characteristics. For example, the SAND material exhibited a large capacitance of 180 nF/cm$^2$, an effective dielectric constant of 4.7, leakage current as low as $10^{-13}$ pA, and breakdown fields as high as 8 MV/cm, as determined from the capacitance measurement. As a result, thin organic dielectrics such as the SAND material promise TFT operation at very low gate and drain-source voltages. Such thin organic dielectrics are mechanically and chemically robust. Careful control of the IAD growth process ensured that such dielectric materials could survive the ion/plasma exposure during metal oxide deposition. Further details concerning the SAND dielectric growth and device fabrication can be found in, for example, Yoon et al., Proc. Natl. Acad. Sci. U.S.A., vol. 102, 4678 (2005); and Yoon et al., J. Am. Chem. Soc., vol. 127, 10388 (2005). Generally, weak adhesion between inorganic and organic interfaces is a significant factor degrading hybrid field-effect transistor performance and stability. For the present devices, the conventional 'Scotch tape' adhesion test reveals no detectable change in multilayer thickness, optical microscopic images or optical transparency before and after the test, indicating that $In_2O_3$ films on the organic dielectrics exhibit strong interfacial adhesion.

Example 6

The metal oxide precursor formulations (from Example 4) were used to fabricate bottom-gate top-contact transistors (BGTC TFTs). More specifically, the formulations were deposited as thin films as described in Example 5, on either an inorganic dielectric layer (e.g., 300 nm $SiO_2$ layer) or an organic dielectric layer (e.g., a solution-processed SAND layer) by spin-coating. The resulting films were annealed at various temperatures and at as low as 250° C. Au source and drain electrodes (50 nm) were deposited by thermal evaporation (pressure ~$10^{-6}$ Torr) through shadow masks, affording channel dimensions of 50/100 μm(L)×5 mm(W). FIG. 1 illustrates the device structure of a representative BGTC TFT.

Example 7

The semiconducting metal oxide thin films, the thin nanoscopic organic dielectric material, the TFT device structures, and their respective electrical properties were characterized as described below. $In_2O_3$ film thicknesses were verified using a Tencor P-10 step profilometer by etching following film growth. XRD θ-2θ scans of $In_2O_3$ were acquired with a Rigaku DMAX-A diffractometer using Ni-filtered Cu Kα radiation. Optical transmittance spectra were acquired with a Cary 500 ultraviolet-visible-near-infrared spectrophotometer and were referenced to the spectrum of uncoated Corning 1737F glass. Film surface morphologies were imaged on a Digital Instruments Nanoscope III atomic force microscope (AFM). Quantitative secondary ion mass spectroscopy (SIMS) analysis was carried out on a MATS quadrupole SIMS instrument using a 15 keV $Ga^+$ ion source. Conductivities of the semiconducting $In_2O_3$ thin films were measured with a Keithley 2182A nanovoltmeter and 6221 current source. The electrical properties of highly conductive ITO and $In_2O_3$ films were characterized on a Bio-Rad HL5500 van der Pauw Hall-effect measurement system. TFT device characterization was carried out on a customized probe station in air with a Keithley 6430 subfemtometer and a Keithley 2400 source meter, operated by a locally written Labview program and GPIB communication.

Example 7a

Figure 8:
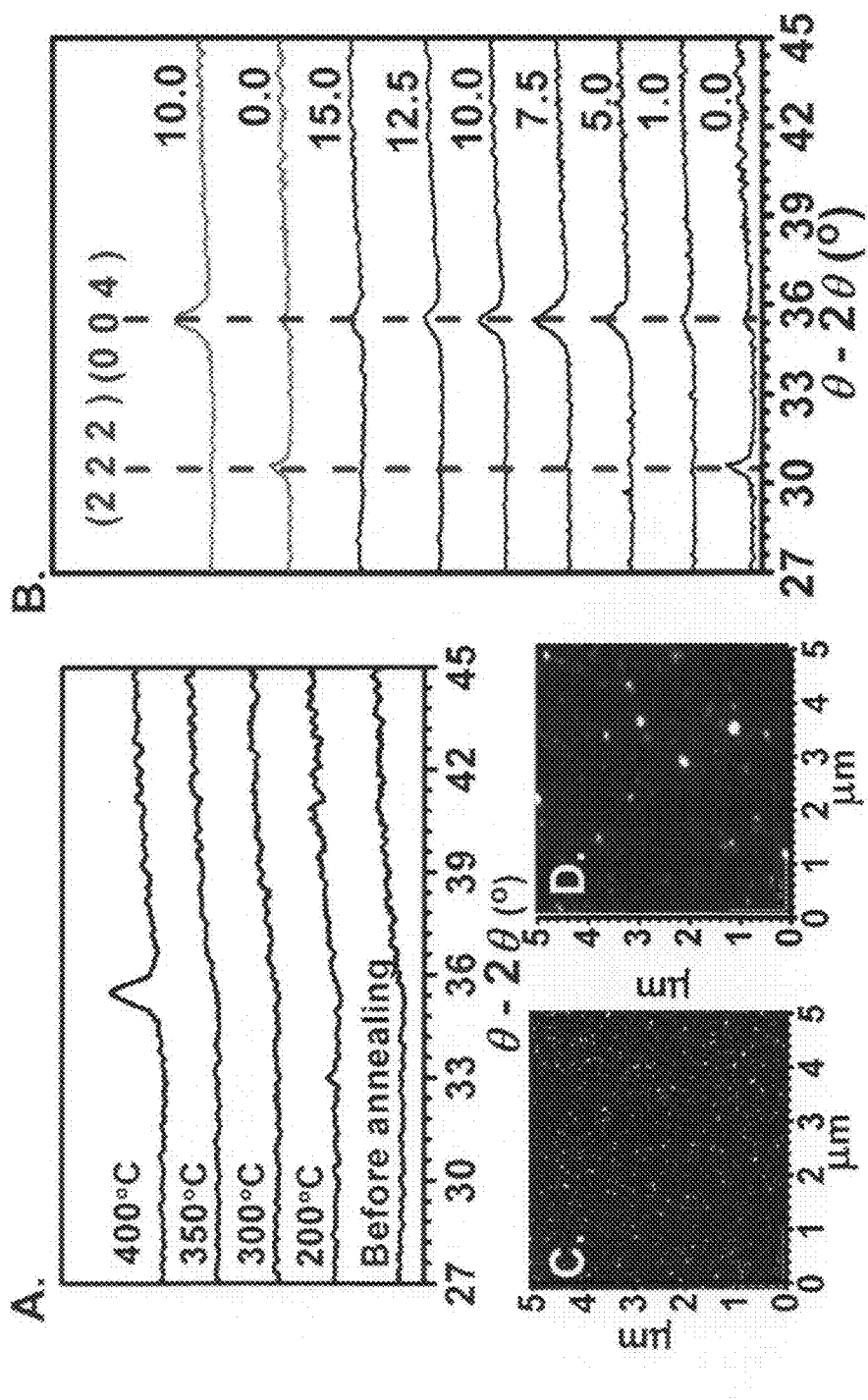
FIG. 8A shows X-ray diffraction (XRD) θ-2θ scans of $In_2O_3$ films (prepared from a formulation having a [ethanolamine]:[$In^{+3}$] ratio of 10) grown on $p^+$-Si/$SiO_2$ substrates.
FIG. 8B shows XRD θ-2θ scans of $In_2O_3$ films ([ethanolamine]:[In$^{3+}$]=10) grown on n$^+$-Si/SAND (top two lines) and p$^+$-Si/SiO$_2$ (line 3 and beyond) substrates.
FIGS. 8C and D show AFM images of In$_2$O$_3$ films ([ethanolamine]:[In$^{3+}$]=10) grown on p$^+$-Si/SiO$_2$ (C) and n$^+$-Si/SAND (D).

FIG. 8A shows X-ray diffraction (XRD) θ-2θ scans of $In_2O_3$ films grown on $p^+$-Si/$SiO_2$ substrates. The $In_2O_3$ films were prepared according to Example 4a, with a molar ratio of ethanolamine:$In^{3+}$=10. For this particular formulation, it appears that the minimum annealing temperature to enable large texturing of the $In_2O_3$ films is about 400° C. FIG. 8B shows XRD θ-2θ scans of $In_2O_3$ films grown on $n^+$-Si/SAND (top two lines) and $p^+$-Si/$SiO_2$ (line 3 and beyond) substrates. The $In_2O_3$ films were prepared according to Example 4a, with the indicated ethanolamine:$In^{3+}$ molar ratio. All films were annealed at 400° C. The critical effect of the concentration of the base included in the semiconductor precursor formulations is evident in these XRD θ-2θ scans. Independent of the underlying gate dielectric, the annealed films deposited from base-free formulations are poorly crystalline and are characterized by the presence of the low carrier mobility 222 $In_2O_3$ reflection. As the base:$In^{+3}$ molar ratio is increased from 0 to 15, the 222 $In_2O_3$ reflection disappears and the high carrier mobility 004 $In_2O_3$ orientation becomes predominant. Interestingly, when the base concentration is increased further (e.g., to a base:$In^{+3}$ molar ratio of 12.5 and 15.0), the corresponding films exhibit the presence of both orientations. Without wishing to be bound by any particular theory, it is believed that microstructure features such as the presence of either orientation or mixed orientations can strongly influence field effect mobilities and other device characteristics of the TFT.

Example 7b

The surface morphologies and grain sizes of spin-coated $In_2O_3$ thin films were examined by contact-mode AFM, and images are shown in FIGS. 8C and D. Regardless of the dielectric substrates on which the $In_2O_3$ thin films were grown on, the films appeared to be compact, dense, uniform, and smooth. The $In_2O_3$ thin films exhibited low RMS roughnesses, e.g., RMS ~3 nm on Si/$SiO_2$, ~6 nm on the Si/organic (SAND) dielectric. Without wishing to be bound by any particular theory, it is believed that low roughness can be attributed to: (1) the smooth underlying dielectric (whether organic or inorganic), which is further supported by AFM; and (2) the intrinsic efficacy of the spin-coating technique to deposit smooth films.

Example 7c

Figure 9:
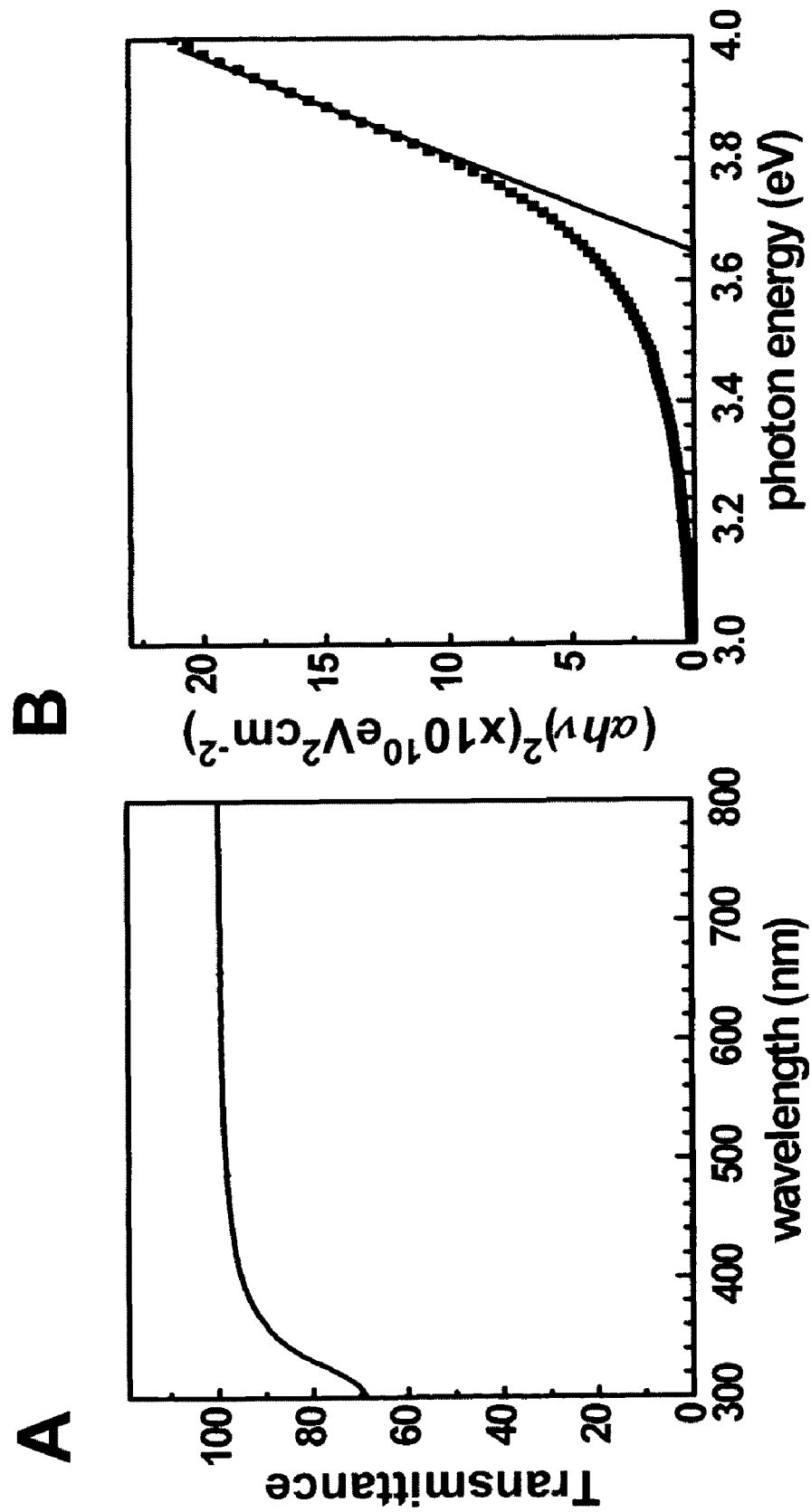
FIGS. 9A and B show optical transmittance spectrum (A) and derivation of the bandgap (B) of In$_2$O$_3$ films ([ethanolamine]:[In$^{3+}$]=10) spin-coated on glass substrates and annealed at 400° C. for 10 minutes.

All of the present solution-processed $In_2O_3$ films are colorless to the eye and spectroscopically transparent, with films deposited on glass substrates exhibiting an average transparency of ~95% in the visible region (FIG. 9A). The optical band gap was investigated and estimated from the optical transmittance spectrum by extrapolating the linear part of the plot of $(\alpha h\upsilon)^2$ versus $h\upsilon$ to $\alpha$=0. The band gap data shows a value of 3.65 eV for the spin-coated-derived $In_2O_3$ films (FIG. 9B). These transmittance and band gap results suggest that $In_2O_3$ thin films are ideal re-channel materials for transparent TFT fabrication.

Example 7d

Figure 10:
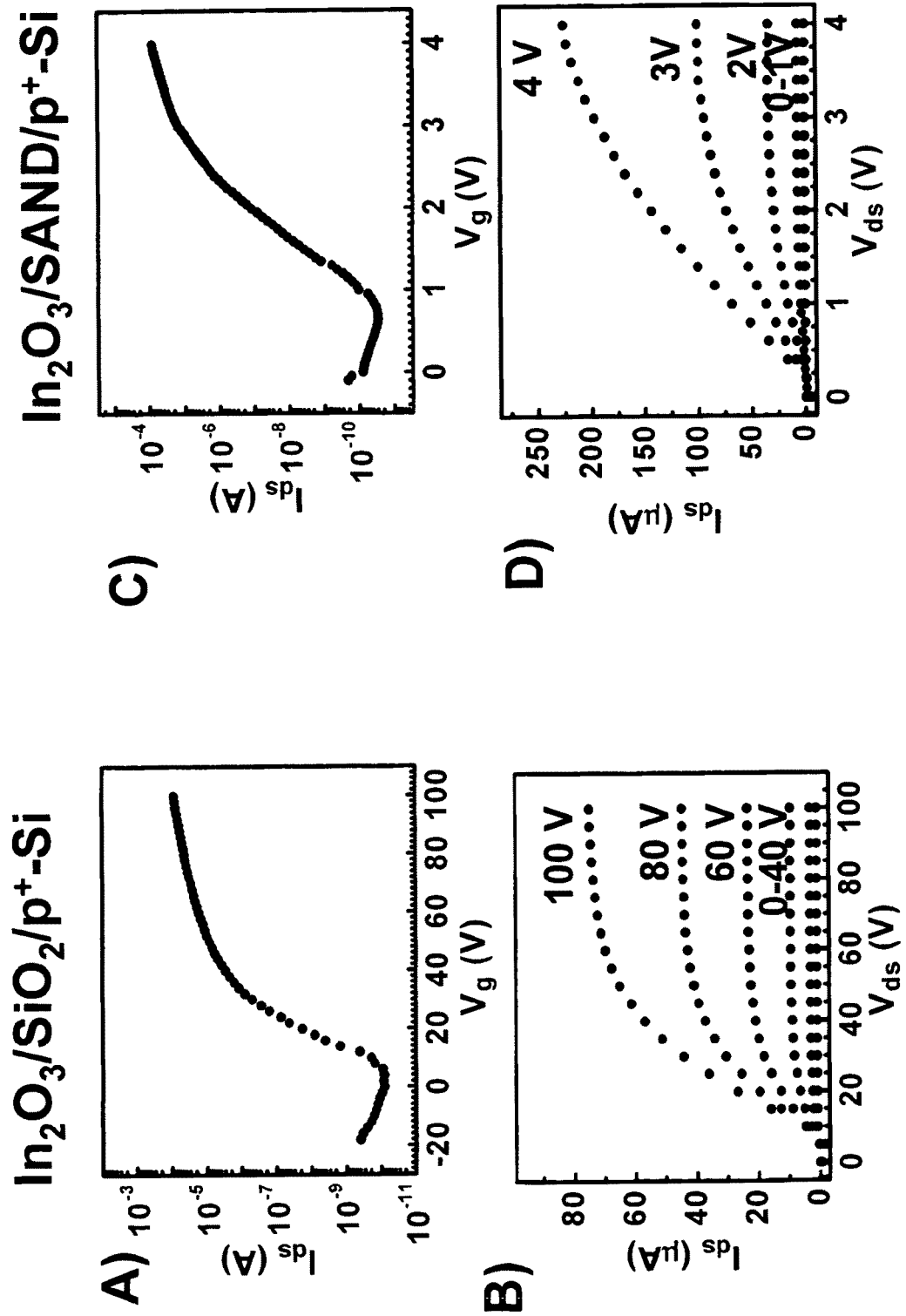
FIG. 10 shows typical transfer (A, C) and output (B, D) plots for representative In$_2$O$_3$-based TFTs having the following structures: A and B—Si/SiO$_2$ (300 nm)/In$_2$O$_3$ (30 nm)/Au (50 nm), L=100 µm, W=1000 µm; C and D—Si/SAND (16.5 nm)/In$_2$O$_3$ (30 nm)/Au (50 nm), L=100 µm, W=500 µm. The In$_2$O$_3$ precursor solution has an [ethanolamine]:[In$^{3+}$] ratio=10.

TFTs were fabricated on both $p^+$-Si/$SiO_2$ substrates and on $n^+$-Si/SAND substrates using the formulations described in Example 4a ($In_2O_3$). The devices have glass/ITO gates and Au or $In_2O_3$ source and drain electrodes. After fabrication, the devices were evaluated in ambient atmosphere. Typical device I-V plots are shown in FIG. 10, and Table 2 below summarizes performance parameters as a function of the base:$In^{3+}$ salt molar ratio and dielectric type.

TABLE 2

| Base/$In^{3+}$ | dielectric/substrate | μ ($cm^2 V^{-1}s^{-1}$)$^a$ | $I_{on}/I_{of}$ | $V_{th}$ (V) | S (V decade$^{-1}$) |
| --- | --- | --- | --- | --- | --- |
| 0.0 (FIG. 7A-B) | $SiO_2$/$p^+$-Si | 0.04 | $10^4$ | 42.6 | 23.8 |
| 1.0 | $SiO_2$/$p^+$-Si | 0.01 | $10^4$ | 44.3 | 16.0 |
| 5.0 | $SiO_2$/$p^+$-Si | 0.05 | $10^4$ | 54.2 | 15.3 |
| 7.5 | $SiO_2$/$p^+$-Si | 0.12 | $10^4$ | 38.0 | 11.4 |
| 10.0 (FIG. 7C-D) | $SiO_2$/$p^+$-Si | 0.70 | $10^6$ | 29.8 | 5.7 |
| 12.5 | $SiO_2$/$p^+$-Si | 0.35 | $10^5$ | 44.6 | 11.2 |
| 15.0 | $SiO_2$/$p^+$-Si | 0.22 | $10^3$ | 36.5 | 26.0 |
| 0.0 | SAND/$n^+$-Si | 5.50 | $10^4$ | 2.6 | 0.4 |
| 10.0 (FIG. 7E-F) | SAND/$n^+$-Si | 43.70 | $10^5$ | 2.2 | 0.3 |

$^a$Calculated in saturation from the equation $\mu = (2I_{SD}L)/[WC_{OX}(V_{SG} - V_{th})^2]$.

Figure 11:
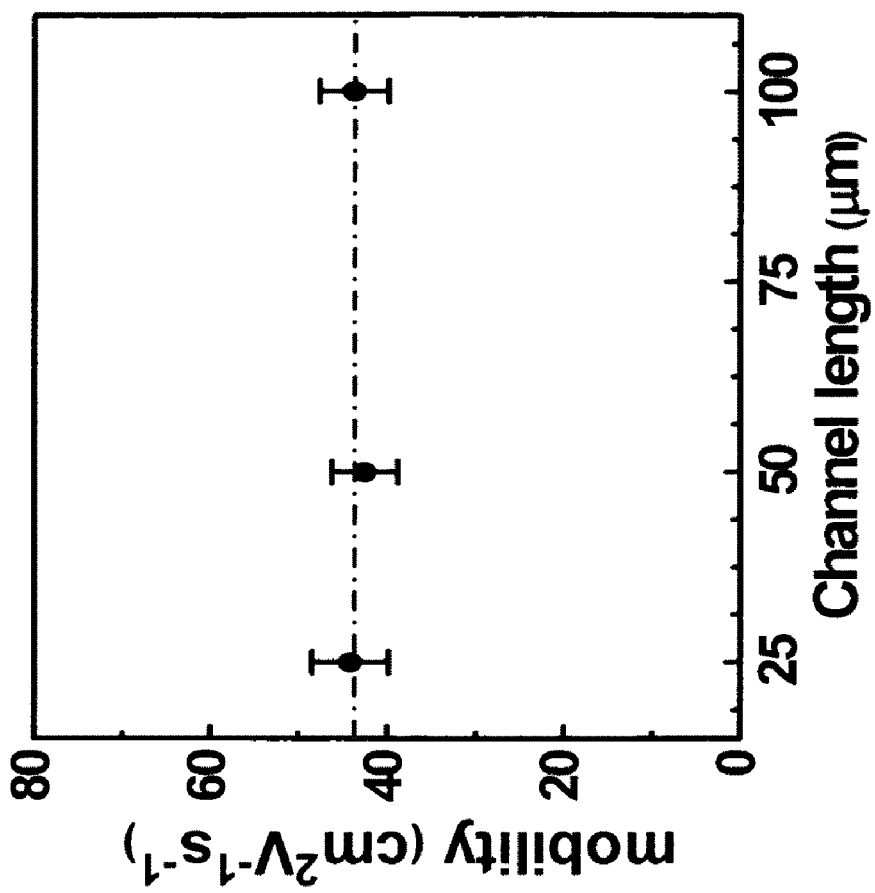
FIG. 11 compares mobilities as a function of channel length (25, 50, 100 mm) of the Si/SAND/In$_2$O$_3$/Au devices ([ethanolamine]:[In$^{3+}$] molar ratio=10).

It can be seen from Table 2 that as the base:$In^{+3}$ molar ratio is increased, the field-effect mobility tracks the microstructural changes observed by XRD. In all cases, the greatest mobility was observed for a [base]:[$In^{+3}$] ratio of about 10. For these formulations, the $In_2O_3$ devices using $SiO_2$ gate dielectrics show reasonable field-effect responses ($\mu_{FE}$=0.7 $cm^2 V^{-1} s^{-1}$; $I_{on}/I_{off}$=$10^6$) with operating voltages in the 0.0-100 V range ($V_{TH}$~29.9 V). Referring again to Table 2 and FIG. 10, $In_2O_3$-organic hybrid TFTs fabricated with the SAND dielectrics exhibit excellent I-V characteristics with classical/crisp pinch-off linear curves and saturation at very low operating voltages (0.0-4.0 V). Analysis of the $n^+$-Si/SAND/$In_2O_3$/Au TFT electrical response reveals large saturation-regime field-effect mobilities, up to about 43.7 $cm^2 V^{-1} s^{-1}$ (using a [base]:[$In^{+3}$] ratio=10). This result combined with $I_{on}/I_{off}$ ratios of ~$10^5$ and <5V operating voltages ($V_{TH}$~2.2 V) makes the present $In_2O_3$ TFTs especially suitable for high-speed applications. Additional Si/$SiO_2$/$In_2O_3$/Au top-contact TFTs were fabricated from formulations having different concentrations of the $InCl_3$ salt, as well as with different thicknesses of the $In_2O_3$ films. Table 3 below summarizes performance parameters as a function of $InCl_3$ salt concentration in the precursor solution ([ethanolamine]:[$In^{+3}$] molar ratio=10). Table 4 below summarizes performance parameters as a function of the $In_2O_3$ film thickness ([ethanolamine]:[$In^{+3}$] molar ratio=10). From the results obtained, it appears that on the given substrates, the optimized film thickness is ~30 nm and the $In^{+3}$ concentration ~0.1M. FIG. 11 compares mobilities as a function of channel length (25, 50, 100 mm) of the Si/SAND/$In_2O_3$/Au devices ([ethanolamine]:[$In^{+3}$] molar ratio=10). As shown in FIG. 11, mobility appears to be independent of channel length. This demonstrates low contact resistance, hence Au is shown to be an excellent contact material for these n-channel semiconductor films. This is of relevance for complementary circuit applications where the n-channel semiconductor has to be combined with a p-channel semiconductor. The latter material usually requires a high work function contact, such as Au, for proper p-channel TFT fabrication.

TABLE 3

| [$InCl_3$][b] | dielectric/substrate | $\mu$ ($cm^2$/Vs) | $I_{on}/I_{off}$ | $V_{th}$ (V) | S (V $decade^{-1}$) |
|---|---|---|---|---|---|
| 0.05 | $SiO_2$/$n^+$-Si | 0.008 | $10^5$ | 46.5 | 13.1 |
| 0.1 | $SiO_2$/$n^+$-Si | 0.70 | $10^6$ | 29.8 | 5.7 |
| 0.2 | $SiO_2$/$n^+$-Si | 1.02 | $10^2$ | 28.2 | 41.6 |

[b]concentration of $InCl_3$ in M

TABLE 4

| $x^c$ | dielectric/substrate | Thickness (nm) | $\mu$ ($cm^2$/Vs) | $I_{on}/I_{off}$ | $V_{th}$ (V) | S (V $decade^{-1}$) |
|---|---|---|---|---|---|---|
| 1 | $SiO_2$/n+-Si | 15 | 0.0002 | $10^2$ | 42.6 | 71.4 |
| 2 | $SiO_2$/n+-Si | 30 | 0.70 | $10^6$ | 29.8 | 5.7 |
| 3 | $SiO_2$/n+-Si | 45 | 1.02 | $10^3$ | 54.2 | 20.1 |
| 4 | $SiO_2$/n+-Si | 50 | 1.15 | $10^2$ | 38.0 | 69.5 |

[c]number of spin-coating

Figure 12:
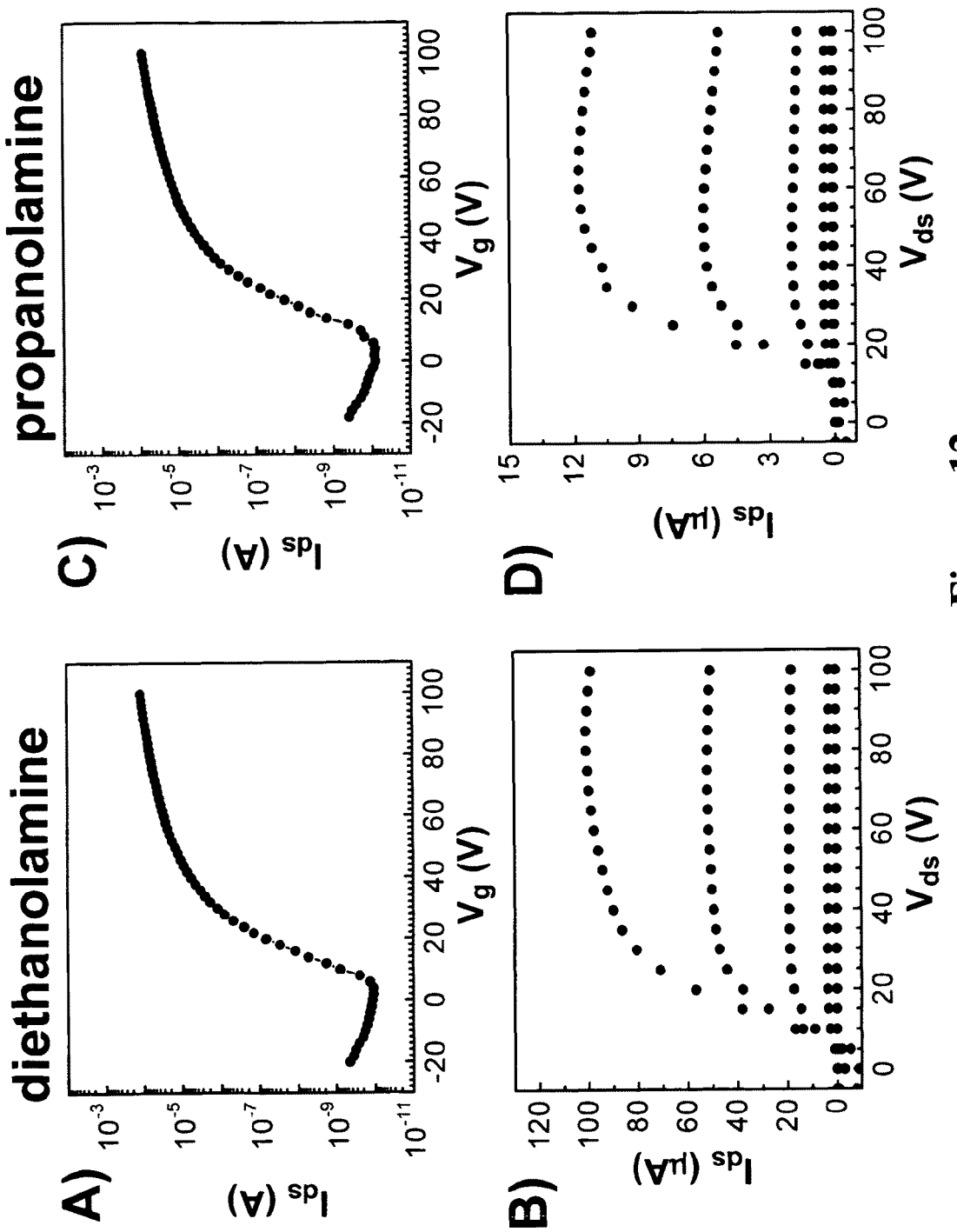
FIG. 12 shows typical transfer (A, C) and output (B, D) plots for representative In$_2$O$_3$-based TFTs having the structure of Si/SiO$_2$ (300 nm)/In$_2$O$_3$ (30 nm)/Au (50 nm), L=100 µm, W=1000 µm, with the In$_2$O$_3$ films prepared from the following In$_2$O$_3$ precursor solutions: A, B—[diethanolamine]:[In$^{3+}$] ratio=10; C, D—[propanolamine]:[In$^{3+}$] ratio=10.

To further illustrate the present teachings, Si/$SiO_2$/$In_2O_3$/Au top-contact TFTs were fabricated using formulations of Examples 4B (diethanolamine) and 4C (propanolamine). Typical device I-V plots are shown in FIG. 12 and Tables 5 and 6 below summarize performance parameters as a function of the base:$In^{3+}$ salt molar ratio.

TABLE 5

| diethanolamine/$In^{3+}$ | $\mu$ ($cm^2 V^{-1}s^{-1}$) | $I_{on}/I_{of}$ | $V_{th}$ (V) | S (V $decade^{-1}$) |
|---|---|---|---|---|
| 0.0 | 0.04 | $10^4$ | 42.6 | 23.8 |
| 0.5 | 0.05 | $10^4$ | 42.4 | 18.2 |
| 1.0 | 0.23 | $10^5$ | 41.5 | 13.7 |
| 2.5 | 0.34 | $10^4$ | 38.0 | 7.8 |
| 5.0 | 0.77 | $10^4$ | 13.2 | 5.1 |
| 7.5 | 0.70 | $10^4$ | 24.1 | 9.4 |

TABLE 6

| propanolamine/$In^{3+}$ | $\mu$ ($cm^2 V^{-1}s^{-1}$) | $I_{on}/I_{off}$ | $V_{th}$ (V) | S (V $decade^{-1}$) |
|---|---|---|---|---|
| 0.0 | 0.04 | $10^4$ | 42.6 | 23.8 |
| 1.0 | 0.06 | $10^6$ | 44.3 | 20.1 |
| 5.0 | 0.19 | $10^4$ | 32.5 | 12.8 |
| 7.5 | 0.48 | $10^4$ | 36.9 | 8.6 |
| 10.0 | 0.61 | $10^4$ | 31.2 | 7.0 |
| 12.5 | 0.37 | $10^5$ | 42.6 | 9.1 |

Figure 13:
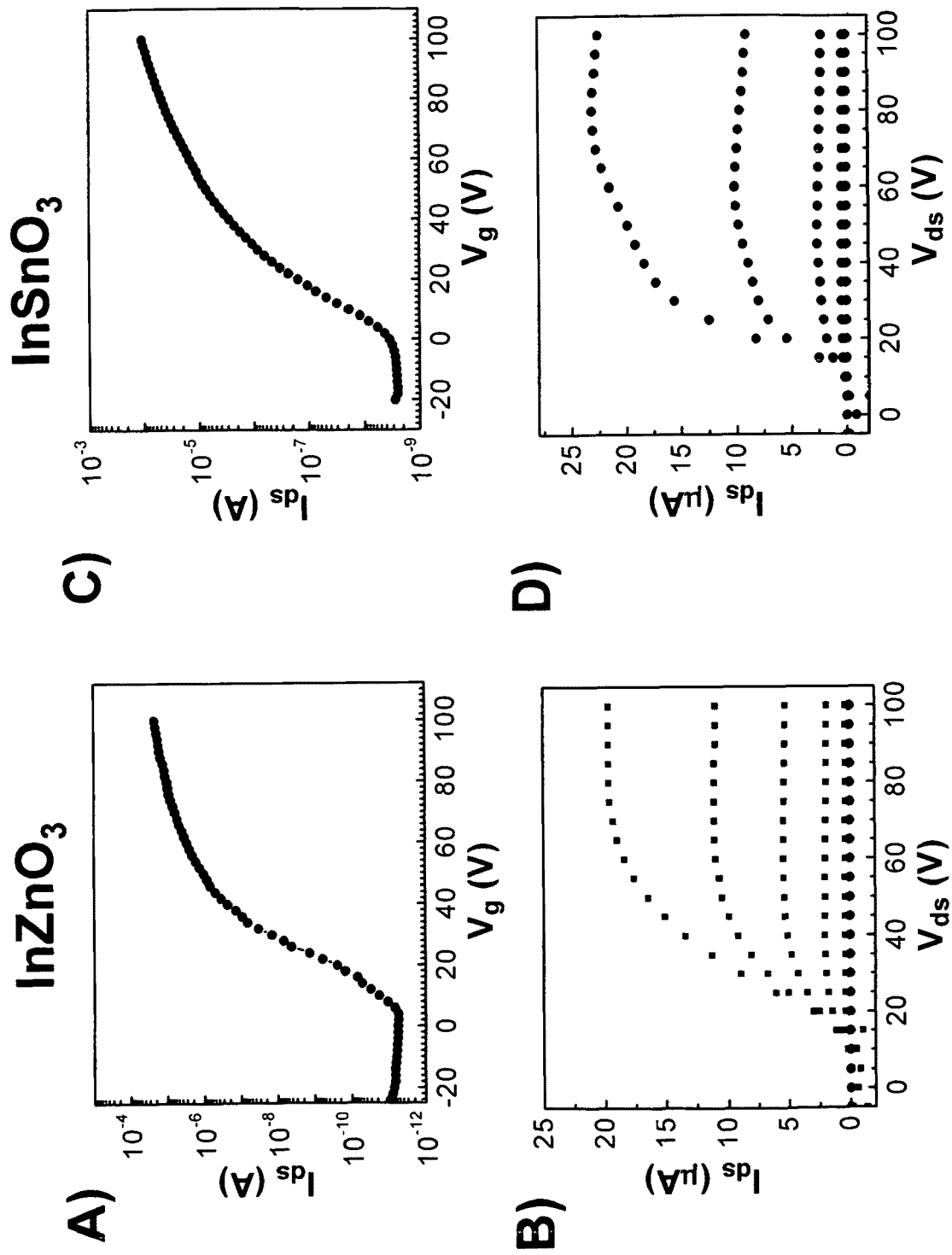
FIG. 13 shows typical transfer (A, C) and output (B, D) plots for representative InZnO$_2$- and InSnO$_2$-based TFTs having the structure of Si/SiO$_2$ (300 nm)/In$_2$O$_3$ (30 nm)/Au (50 nm), L=100 µm, W=1000 µm, with the metal oxide films prepared from the following precursor solutions: A, B—[ethanolamine]:[In$^{3+}$+Zn$^{2+}$] ratio=10; C, D—[ethanolamine]:[In$^{3+}$+Sn$^{4+}$] ratio=10.
Figure 14:
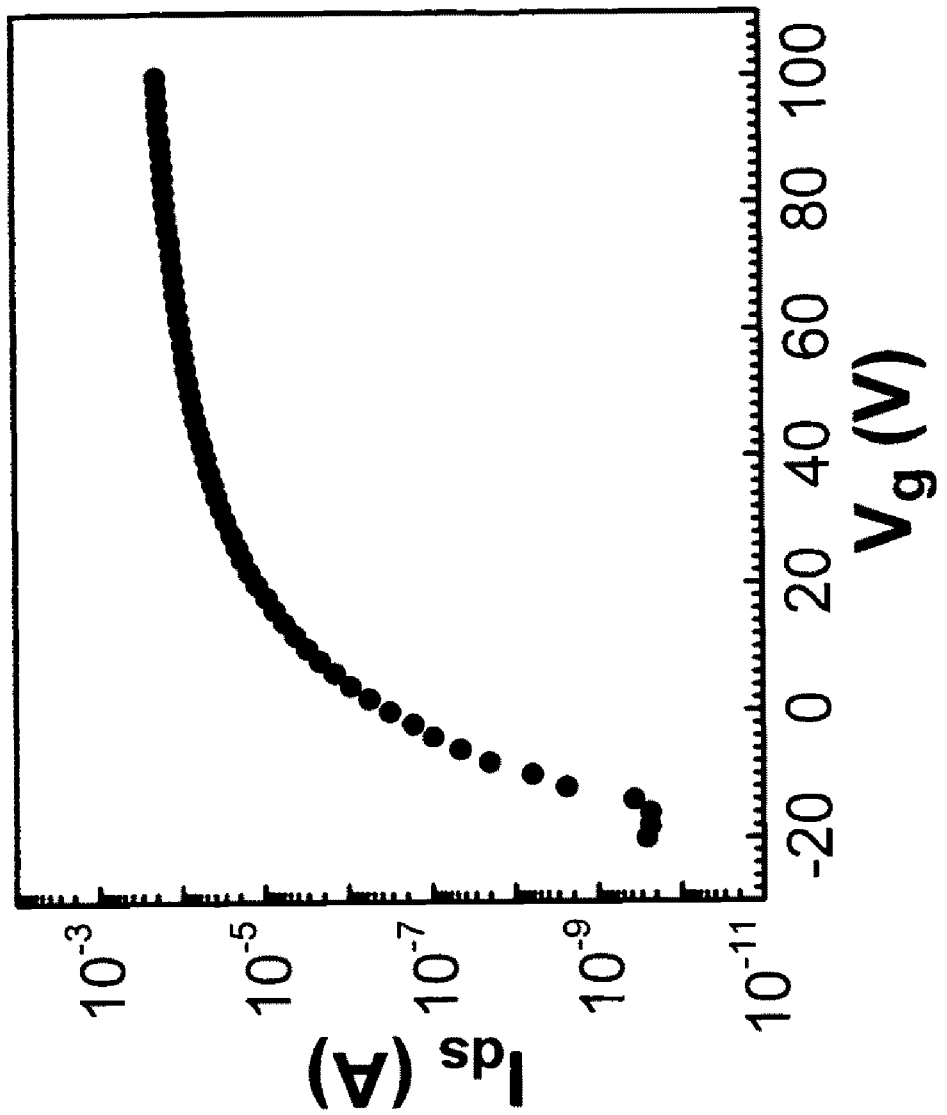
FIG. 14 shows a typical transfer plot for a representative SnO$_2$-based TFT, with the SnO$_2$ film prepared from a precursor solution having an [ethanolamine]:[Sn$^{4+}$] ratio=10.

To demonstrate that the present teachings can be applied to various metal oxides, Si/$SiO_2$/$InZnO_2$/Au, Si/$SiO_2$/$InSnO_2$/Au, and Si/$SiO_2$/$SnO_2$/Au top-contact TFTs were fabricated according to the procedures described above in connection with $In_2O_3$-based TFTs. Typical device I-V plots are shown in FIGS. 13 and 14, and Tables 7 and 8 below summarize performance parameters as a function of the [ethanolamine]:[combined salt] ratio for $InZnO_2$ and $InSnO_2$, respectively. The $SnO_2$ devices show reasonable field-effect responses ($\mu_{FE}$=0.5 $cm^2 V^{-1} s^{-1}$; $I_{on}/I_{off}$=$10^6$) with operating voltages in the 0.0-0.4 V range ($V_{TH}$~2.16 V).

TABLE 7

| Ethanolamine/($In^{3+}$ + $Zn^{2+}$) | $\mu$ ($cm^2 V^{-1}s^{-1}$) | $I_{on}/I_{off}$ | $V_{th}$ (V) | S (V $decade^{-1}$) |
|---|---|---|---|---|
| 0.0 | — | — | — | — |
| 1.0 | 0.01 | $10^4$ | 44.3 | 25.3 |
| 2.0 | 0.12 | $10^4$ | 54.2 | 13.3 |
| 3.0 | 0.27 | $10^4$ | 38.0 | 9.1 |
| 4.0 | 0.70 | $10^6$ | 29.8 | 5.8 |
| 5.0 | 0.37 | $10^5$ | 44.6 | 7.2 |

TABLE 8

| Ethanolamine/($In^{3+}$ + $Sn^{4+}$) | $\mu$ ($cm^2 V^{-1}s^{-1}$) | $I_{on}/I_{off}$ | $V_{th}$ (V) | S (V $decade^{-1}$) |
|---|---|---|---|---|
| 0.0 | — | — | — | — |
| 1.0 | 0.58 | $10^4$ | 53.3 | 13.7 |
| 2.0 | 0.92 | $10^5$ | 35.5 | 10.8 |
| 3.0 | 0.18 | $10^5$ | 53.2 | 13.2 |
| 4.0 | 0.02 | $10^3$ | 29.8 | 15.8 |

Example 8

Figure 15:
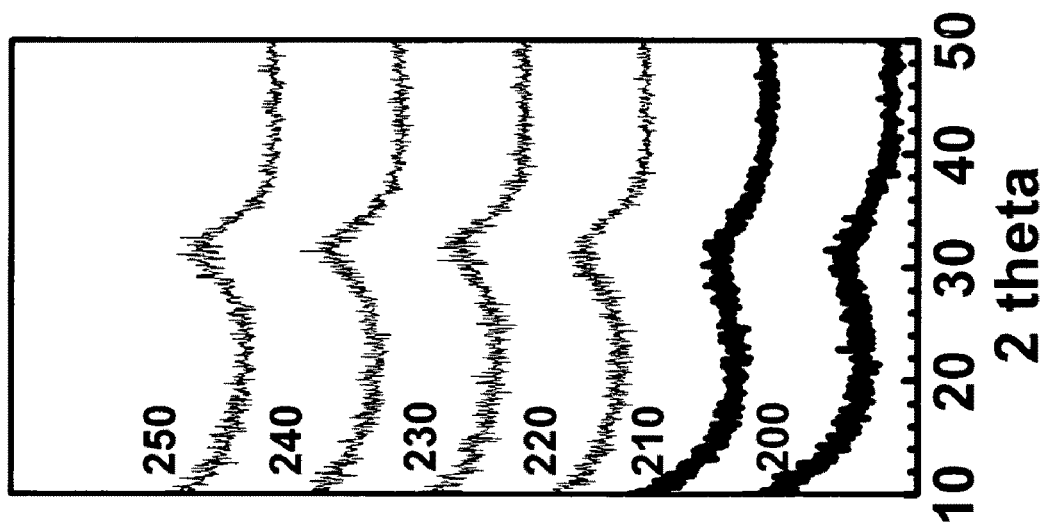
FIG. 15 shows X-ray diffraction (XRD) θ-2θ scans of indium tin oxide (ITO) films spin-coated on n$^+$Si/SAND and annealed between about 200° C. and about 250° C.

To further illustrate the present teachings, Si/SAND/ITO/Au top-contact TFTs were fabricated, with the semiconductor component prepared from the formulation of Example 4e and spin-coated onto the SAND-coated substrate. The resulting films were annealed at various temperatures and at as low as 200° C. The formation of amorphous metal oxides was verified by XRD techniques as shown in FIG. 15. The thickness of a one-time spin-coated ITO film was determined to be about 16.4 nm from X-ray Reflectometry.

The surface morphologies and grain sizes of spin-coated ITO thin films were examined by contact-mode AFM.

Regardless of the annealing temperature, the ITO thin films were observed to be compact, dense, uniform, and smooth from the AFM images. For example, the ITO thin film exhibited low RMS roughnesses. Without wishing to be bound by any particular theory, it is believed that low roughness can be attributed to: (1) the smooth underlying dielectric, and (2) the intrinsic efficacy of the spin-coating technique to deposit smooth films.

The as-grown ITO films are colorless and highly optically transparent, and similar films deposited on plain glass show an average transparency of about 90% in the visible region (FIG. 16A). The optical band gap was estimated to be about 3.65 eV from the optical transmittance spectrum (FIG. 16B).

Example 9

The performance of the ITO TFT devices was investigated as a function of annealing temperatures and ratios of $[In^{3+}]$:$[Sn^{4+}+In^{3+}]$. The tested devices have the structure of Si/SiO$_2$ (300 nm)/ITO/Au, L=100 µm, W=1000 µm.

It was observed that mobility increased as the annealing temperature increased from 200° C. to 250° C. (FIGS. 17A-D and F). More specifically, mobility gradually increases from 0.04 cm$^2$V$^{-1}$ s$^{-1}$ at 200° C. to 2.11 cm$^2$V$^{-1}$ s$^{-1}$ at 250° C. Values are summarized in Table 9 below.

TABLE 9

| Temperature (° C.) | µ (cm$^2$ V$^{-1}$s$^{-1}$) | $I_{on}/I_{off}$ | Vth (V) |
|---|---|---|---|
| 200 | 0.04 | 10$^3$ | 34.2 |
| 210 | 0.12 | 10$^5$ | 25.9 |
| 220 | 0.21 | 10$^5$ | 17.2 |
| 230 | 0.24 | 10$^5$ | 21.4 |
| 240 | 0.92 | 10$^6$ | 20.6 |
| 250 | 2.11 | 10$^5$ | 13.0 |

Figure 17:
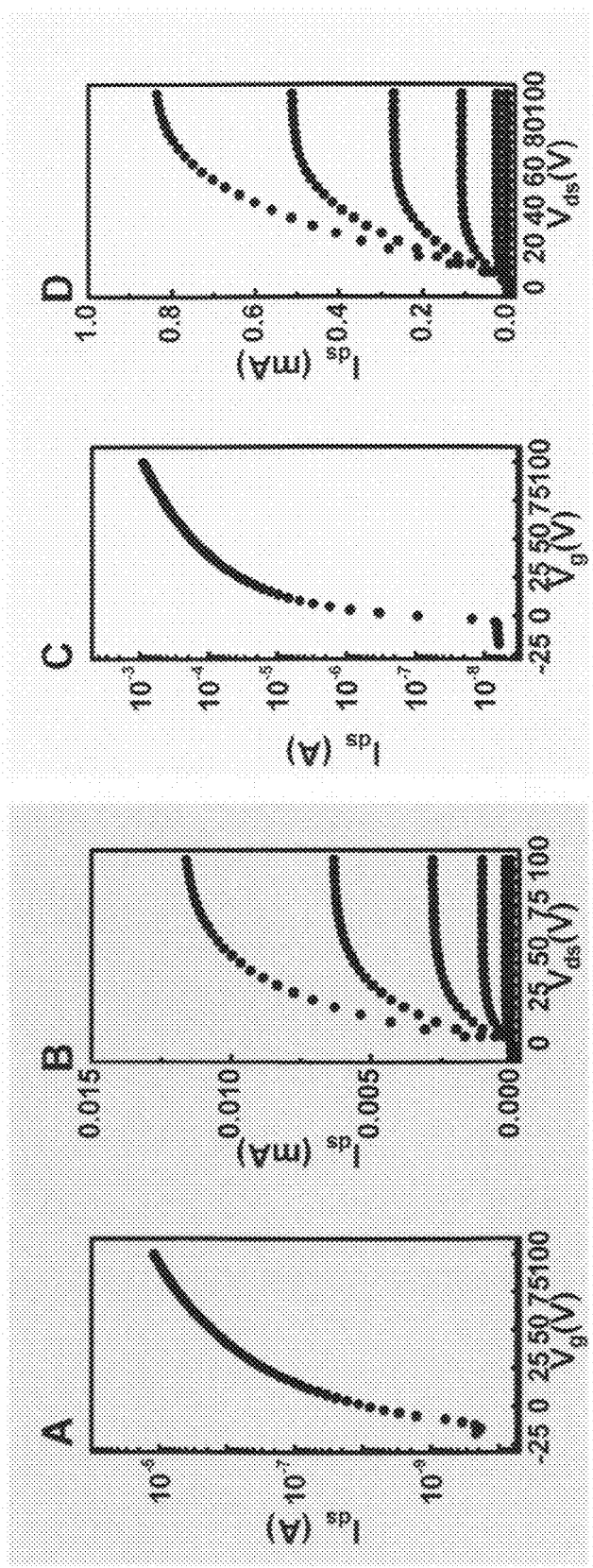
FIG. 17 shows typical transfer (A, C) and output (B, D) plots for representative ITO-based TFTs having the structure of Si/SiO$_2$/ITO/Au, L=100 µm, W=1000 µm, with the ITO films prepared from a precursor solution having a ratio of [In$^{3+}$] to [In$^{3+}$+Sn$^{4+}$]~7, and annealed at 200° C. (A, B) and 250° C. (C, D).

It was found that by increasing the ratio of indium in the ITO films, mobility also improved (FIG. 17E).

Example 10

The $I_{DS}$-$V_{DS}$ transfer and output characteristics of TFTs composed of ITO as n-channel semiconductor layer annealed at 250° C. and SAND as dielectric layer with channel length and width of 100 µm and 500 µm, respectively, are shown in FIG. 18. The results show high mobility and high $I_{on}/I_{off}$ ratio at low operating voltage (1.54 V). Analysis of their electrical response reveals large saturation regime field-effect mobilities, up to about 20.1 cm$^2$V$^{-1}$ s$^{-1}$ (using a $[In^{3+}]$:$[Sn^{4+}+In^{3+}]$~7) with good $I_{on}/I_{off}$ ratio ~10$^4$.

We claim:

1. A solution-phase method of preparing a thin film transistor device, said method comprising:
   providing a first fluid medium comprising an inorganic semiconductor component at least partially soluble therein, said inorganic semiconductor component comprising a compound selected from metal selenides, sulfides, oxides, tellurides, pnictinides, phosphides, nitrides, carbides, arsenides, and combinations thereof, said metal selected from Group 12-Group 15 metals;
   contacting said first fluid medium with a substrate component;
   annealing said inorganic semiconductor component to provide a semiconductor film;
   providing a second fluid medium comprising a dielectric component at least partially soluble therein; and
   coupling said dielectric component to said inorganic semiconductor film.

2. The method of claim 1 comprising depositing said second fluid medium onto the substrate component to provide a thin film composition prior to contact with said first fluid medium.

3. The method of claim 2 wherein said depositing comprises printing or spin-coating.

4. The method of claim 2 wherein said thin film composition is positioned in said first fluid medium.

5. The method of claim 4 wherein said semiconductor component is the reaction product of precursor reagents at least partially soluble in said first fluid medium.

6. The method of claim 5 wherein said semiconductor component is a metal selenide.

7. The method of claim 6 wherein said dielectric component comprises a multi-layered assembly comprising multiple self-assembled monolayers.

8. The method of claim 7 wherein said dielectric component comprises at least one organic dipolar layer comprising a π-polarizable moiety.

9. The method of claim 7 wherein said dielectric component comprises a hydrocarbon layer coupled with silicon-oxygen bonds to at least one said dipolar layer.

10. The method of claim 9 wherein said dielectric component comprises at least one siloxane capping layer coupled to at least one said dipolar layer with silicon-oxygen bonds.

11. The method of claim 7 wherein said dielectric component comprises at least one inorganic layer comprising a transition metal compound, the transition metal of the transition metal compound being a Group 4 metal selected from titanium, zirconium, and hafnium.

12. The method of claim 7 wherein said semiconductor component is CdSe.

13. The method of claim 1 comprising depositing said second fluid medium onto the semiconductor film.

14. The method of claim 13 wherein said depositing comprises printing or spin-coating.

15. The method of claim 1 wherein contact of said first fluid medium with said substrate component comprises a process selected from printing and casting processes.

16. The method of claim 1 wherein said contact comprises a process selected from inkjet printing, screen-printing, gravure printing, offset printing, pad printing, lithographic printing, flexographic printing, microcontact printing, spin-coating, drop-casting, zone casting, dip coating, blade coating, and spraying.

17. The method of claim 15 wherein said semiconductor component is the reaction product of precursor reagents at least partially soluble in said first fluid medium.

18. The method of claim 17, wherein said first fluid medium comprises one or more metal salts, wherein the metal of the one or more metal salts is selected from indium, tin, zinc, and gallium.

19. The method of claim 17, wherein said first fluid medium comprises one or more trivalent metal salts and a base in a solvent.

20. The method of claim 19, wherein said base is an aminoalcohol selected from ethanolamine, propanolamine, and diethanolamine.

21. The method of claim 19, wherein the ratio of said base to said one or more trivalent metal salts is between about 1 and about 15.

22. The method of claim 19, wherein said medium comprises a second metal salt selected from a divalent metal salt or a tetravalent metal salt.

23. The method of claim 22, wherein the ratio of said base to said one or more metal salts is between about 1 and about 15.

24. The method of claim 19, wherein the one or more metal salts are selected from halides, oxalates, carbonates, acetates, formates, propionates, sulfites, sulfates, acetylacetonates, hydroxides, nitrates, perchlorates, trifluoroacetates, trifluoroacetylacetonates, trifluoromethanesulfonates, tosylates, mesylates, and hydrates thereof.

25. The method of claim 15 wherein said semiconductor component is a metal oxide.

26. The method of claim 15 wherein said semiconductor component is annealed at a temperature lower than or about 400° C.

27. The method of claim 15 wherein said semiconductor component is annealed at a temperature lower than or about 250° C.

28. The method of claim 15 wherein said semiconductor component is annealed at a temperature lower than or about 100° C.

29. The method of claim 1 wherein said dielectric component is an inorganic material.

30. The method of claim 1 wherein said dielectric component is selected from dielectric polymers and a component comprising at least one organic dipolar layer comprising a π-polarizable moiety, said layer cross-linked with a siloxane bond sequence.

31. The method of claim 30 wherein said dielectric polymer is selected from poly(vinylphenol), polystyrene, poly(methylmethacrylate) and copolymers thereof.

32. The method of claim 30 wherein said dielectric component comprises a hydrocarbon layer coupled with silicon-oxygen bonds to at least one said dipolar layer.

33. The method of claim 32 wherein said dielectric component comprises at least one siloxane capping layer coupled to at least one said dipolar layer with silicon-oxygen bonds.

34. The method of claim 33 wherein one of said siloxane capping layers is between one said dipolar layer and one said hydrocarbon layer and coupled to each of said layers with silicon-oxygen bonds.

35. The method of claim 30 wherein said dipolar layer comprises a non-linear optical chromophore.

36. The method of claim 35 wherein said chromophore comprises a stilbazolium moiety.

37. The method of claim 30 wherein said dielectric component is coupled to a substantially transparent substrate.

38. The method of claim 37 wherein the device is a transparent thin film transistor.

39. The method of claim 1 wherein said inorganic semiconductor component is a metal oxide and said dielectric component comprises a multi-layered assembly comprising multiple self-assembled monolayers.

40. The method of claim 39 wherein said dielectric component comprises at least one organic dipolar layer comprising a π-polarizable moiety, said organic dipolar layer being assembled by a condensation reaction between a precursor comprising a π-polarizable moiety and a precursor comprising a siloxane moiety.

41. The method of claim 40 wherein said dielectric component comprises at least one siloxane capping layer coupled to at least one said dipolar layer with silicon-oxygen bonds.

42. The method of claim 41 wherein one of said siloxane capping layers is between one said dipolar layer and one said hydrocarbon layer and coupled to each of said layers with silicon-oxygen bonds.

43. The method of claim 39 wherein said dielectric component comprises a hydrocarbon layer coupled with silicon-oxygen bonds to at least one said dipolar layer, said hydrocarbon layer being assembled by a condensation reaction between a precursor comprising a bis(silylated) alkyl moiety and a precursor comprising a siloxane moiety.

44. The method of claim 39 wherein said dielectric component comprises at least one inorganic layer comprising a transition metal compound, the transition metal of the transition metal compound being a Group 4 metal selected from titanium, zirconium, and hafnium.

45. The method of claim 39 wherein said inorganic semiconductor component is the reaction product of precursor reagents at least partially soluble in said first fluid medium.

46. The method of claim 39 wherein said first fluid medium comprises one or more metal salts and a base in a solvent, wherein the metal of the one or more metal salts is selected from indium, tin, zinc, and gallium.

47. The method of claim 46 wherein said first fluid medium comprises an indium salt and a base in a solvent, and wherein the ratio of said base to said indium salt is between about 5 and about 15.

48. The method of claim 46 wherein said first fluid medium comprises two or more metal salts and a base in a solvent, wherein the two or more metal salts comprise an indium salt, a zinc salt, and at least one of a tin salt and a gallium salt.

* * * * *